United States Patent
Yamawaki et al.

[11] Patent Number: 6,158,038
[45] Date of Patent: *Dec. 5, 2000

[54] METHOD AND APPARATUS FOR CORRECTING DATA ERRORS

[75] Inventors: Hirofumi Yamawaki; Masashi Yamawaki; Kenichi Yamakura, all of Kasugai, Japan

[73] Assignee: Fujitsu Limited, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/929,063

[22] Filed: Sep. 15, 1997

[30] Foreign Application Priority Data

Nov. 15, 1996 [JP] Japan ................................ 8-304978
Jun. 6, 1997 [JP] Japan ................................ 9-149514

[51] Int. Cl.⁷ .................................................. H03M 13/00
[52] U.S. Cl. ........................................... 714/755; 714/752
[58] Field of Search ................................. 371/37.4, 37.7, 371/39.1, 40.11; 714/755, 756, 758, 763, 752

[56] References Cited

U.S. PATENT DOCUMENTS

| | | | |
|---|---|---|---|
| Re. 34,100 | 10/1992 | Hartness | 714/769 |
| 4,769,818 | 9/1988 | Mortimer | 371/37.4 |
| 4,881,232 | 11/1989 | Sako et al. | 371/37.4 |
| 5,068,855 | 11/1991 | Kashida et al. | 714/755 |
| 5,371,745 | 12/1994 | Kiyonaga et al. | 371/37.7 |
| 5,684,810 | 11/1997 | Nakamura et al. | 371/37.4 |
| 5,757,825 | 5/1998 | Kimura et al. | 371/37.7 |
| 5,781,918 | 7/1998 | Lieberman et al. | 711/5 |

FOREIGN PATENT DOCUMENTS

| | | |
|---|---|---|
| 0523969 A1 | 1/1993 | European Pat. Off. |
| 061208430 B1 | 4/1994 | Japan . |
| 07262031 | 10/1995 | Japan . |

*Primary Examiner*—Albert De Cady
*Assistant Examiner*—Shelly A Chase
*Attorney, Agent, or Firm*—Staas & Halsey LLP

[57] ABSTRACT

An error correcting method reducing the time needed to provide error correction using a buffer memory. The method includes performing row error correction by using a plurality of rows of data to produce row-corrected block data and performing column error correction by using the plurality of columns of data to produce column-corrected block data. In addition, at least one of the performing row error correction and performing column error correction operates using a plurality of rows or columns of data in units of a predetermined number of rows or columns so as to provide error correction for the plurality of rows or columns in parallel.

37 Claims, 17 Drawing Sheets

US 6,158,038

METHOD AND APPARATUS FOR CORRECTING DATA ERRORS

BACKGROUND OF THE INVENTION

1. Field of the Invention

The present invention relates generally to a method and apparatus for correcting data errors and, more particularly, to a method and apparatus for correcting errors in data recorded on a recording medium.

2. Description of the Related Art

In the case of using a recording medium having an increased record capacity, such as an optical disk, fast reading of data from the recording medium is demanded. For faster reading of data from the recording medium, the time required for error correction of read data should be shortened. To shorten this processing time, it is necessary to quickly access a buffer memory where data is to be stored.

An error correcting code (ECC) is affixed to data when the data is to be recorded on a recording medium. As shown in FIG. 1, for example, a block data 11, which includes a data portion 12 and first and second ECCs 13 and 14, is recorded on a recording medium. The data portion 12 includes plural pieces of data in a matrix form. Each of the first and second ECCs 13 and 14 includes plural pieces of correcting code data in a matrix form. The first ECC 13 is affixed to each column of data in the data portion 12. The second ECC 14 is affixed to each row of data in the data portion 12 and the first ECC 13.

A data reading apparatus is equipped with a controller which controls the input/output access of data to a recording medium. The controller has an error correcting circuit for correcting an error in the block data 11. The error correcting circuit receives each row of data in each of the data portion 12 and the first and second ECCs 13 and 14 a byte at a time, and performs a predetermined arithmetic operation on the data. Based on the result of the arithmetic operation, an error contained in each row of data is corrected. Further, the error correcting circuit receives each column of data in each of the data portion 12 and the first ECC 13, a byte at a time, and performs a predetermined arithmetic operation on the data. Based on the result of that operation, an error contained in each column of data is corrected.

Since powerful error correction using all of the data portion 12 and the first and second ECCs 13 and 14 is carried out, the error correction requires a buffer memory having a large memory capacity. The error correcting circuit receives data read from the buffer memory and executes error correction on the data to yield error-corrected data. The error-corrected data is temporarily stored in the buffer memory. The error-corrected data read from the buffer memory is thereafter supplied to a host computer.

As the processing speed of host computers increases, faster reading/writing of data from/to a buffer memory is demanded. For instance, by using a high-speed host computer, data is read from an optical disk at a high speed while rotating the optical disk at a speed four times the normal speed.

Such high-speed reading, however, requires fast access to a buffer memory. Access to the buffer memory for reading data therefrom and access to the buffer memory for writing error-corrected data therein both occurring repeatedly in units of individual bytes, consumes a large amount of time. Such numerous accesses to the buffer memory makes it difficult to shorten the error correcting time. Thus, there is a need for improved techniques to perform error correction on data read from a recording medium.

SUMMARY OF THE INVENTION

Broadly speaking, the present invention relates to an error correcting method and apparatus which shortens the time needed to perform error correction using a buffer memory. The present invention can be implemented in numerous ways including as an apparatus and a method.

The present invention provides a method of correcting an error of block data having a matrix form including a plurality of rows of data and a plurality of columns of data. The method includes performing a row error correction by using the plurality of rows of data to produce row-corrected block data, and performing column error correction by using the plurality of columns of data to produce column-corrected block data. At least one of the performing row error correction and the performing column error correction operates using a plurality of rows or columns of data in units of a predetermined number of rows or columns to provide error correction for the plurality of rows or columns in parallel.

The present invention also provides a method of mapping block data into a memory. The block data is in a matrix form and has a plurality of rows of data and a plurality of columns of data. The method includes providing a memory having a data bus and a plurality of limited memory areas, the memory being designed so that when a part of block data is stored in one limited memory area, a speed of accessing the one limited memory area is faster than an access speed from one limited memory area to another limited memory area, setting a width of the data bus of the memory wide enough to permit passing of a plurality of columns of data in units of a predetermined number of columns, storing the block data in individual limited memory areas of the memory via the data bus, in unit of a row, so that a part of a plurality of rows of data is stored in one limited memory area, and subsequently reading columns of data, associated with the part of the plurality of rows of data stored in the individual limited memory areas, from the memory via the data bus in units of the predetermined number of columns.

The present invention provides a method of correcting an error in block data in a matrix form having a plurality of rows of data and a plurality of columns of data. The method includes providing a memory having a data bus and a plurality of limited memory areas, the memory being designed so that when a part of block data is stored in one limited memory area, a speed of accessing the one limited memory area is faster than an access speed from one limited memory area to another limited memory area, setting a width of the data bus of the memory wide enough to permit passing of a plurality of columns of data in units of a predetermined number of columns, performing row error correction in units of a row by using the rows of data to generate row-error corrected block data, storing the block data in the memory via the data bus, in units of a row, so that a part of a plurality of rows of data is stored in one limited memory area, reading columns of data, associated with the part of the plurality of rows of data stored in the limited memory areas, from the memory via the data bus in units of the predetermined number of columns, and performing column error correcting processes in units of the predetermined number of columns in parallel by using the columns of data to generate column-error corrected block data.

The present invention provides an apparatus for correcting an error in block data having a matrix form including a plurality of rows of data and a plurality of columns of data. The apparatus includes a row error correction circuit for performing a row error correction by using the plurality of rows of data to produce row-corrected block data, and a column error correction circuit for performing a column error correction by using the plurality of columns of data to produce column-corrected block data. At least one of the row error correction circuit and the column error correction circuit operates to perform an error correction of row or column in parallel by using a plurality of rows or columns of data in units of a predetermined number of rows or columns.

The present invention also provides an apparatus for correcting an error in block data having a matrix form including a plurality of rows of data and a plurality of columns of data. The apparatus is coupled to an external memory through a data bus and having a plurality of limited memory areas. The external memory is designed so that when a part of the block data is stored in one of the limited memory areas, a speed of accessing the one of the limited memory areas is faster than an access speed from one limited memory area to another limited memory area. The data bus has a width large enough to permit passing of a plurality of columns of data in units of a predetermined number of columns. The apparatus includes a row error correcting circuit for performing row error correction in units of a row by using the rows of data to generate row-error corrected block data, a memory controller, coupled to the external memory and the row error correction circuit, for storing the block data in the memory via the data bus, in units of a row, so that a part of a plurality of rows of data is stored in one of the limited memory areas and for reading columns of data, associated with the part of the plurality of rows of data stored in one of the limited memory areas, from the memory via the data bus in units of the predetermined number of columns, and a column error correcting circuit for performing column error correcting processes in units of the predetermined number of columns in parallel by using the columns of data to generate column-error corrected block data.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

First Embodiment

Figure 1:
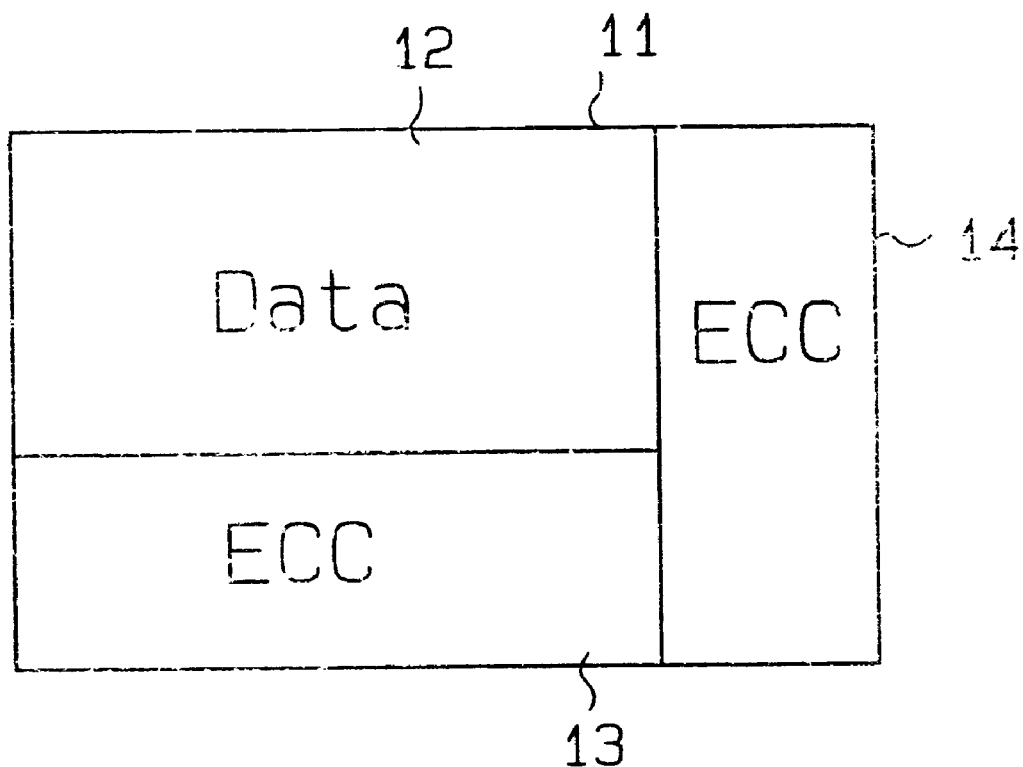
FIG. 1 shows a data portion and two ECC portions to be affixed to the data.
Figure 2:
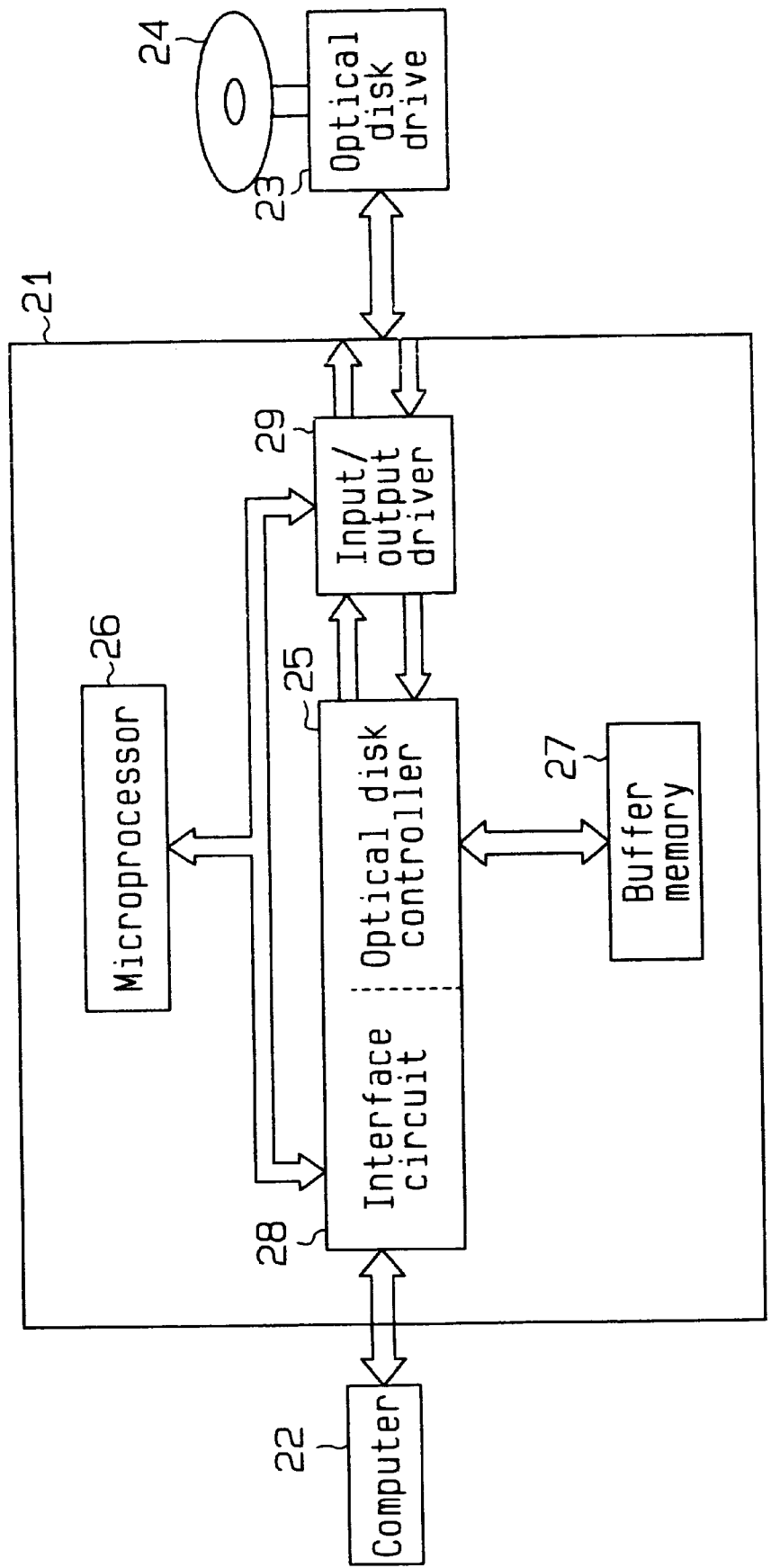
FIG. 2 is a block diagram illustrating an optical disk control unit according to a first embodiment of the invention.

An optical disk control unit according to a first embodiment of the invention will now be described referring to the accompanying drawings. As shown in FIG. 2, an optical disk control unit 21 is connected to a computer 22 via an interface (not shown) such as an AT attachment packet interface (ATAPI). The optical disk control unit 21 is further connected to an optical disk drive 23 via an interface (not shown).

The optical disk drive 23, which rotates a digital video disk (DVD) 24 as a recording medium at a predetermined speed, has an optical pickup (not shown) for reading data recorded on the DVD 24. The optical disk drive 23 supplies read data to the optical disk control unit 21.

The optical disk control unit 21 includes an optical disk controller (hereinafter called "controller") 25, a microprocessor 26, an external buffer memory 27 as a memory device, an interface circuit 28 and an input/output (I/O) driver 29. A dynamic random access memory (DRAM), a static random access memory (SRAM) or the like may be used as the external buffer memory 27.

The controller 25 executes the following processes:

1) Sending commands to the optical disk drive 23 and receiving a status therefrom,
2) Decoding the format of data read from the DVD 24 and error correction on the data,
3) Data transfer between the optical disk drive 23 and the buffer memory 27, and
4) Data transfer between the interface circuit 28 and the buffer memory 27.

The controller 25 receives data read from the optical disk drive 23 via the I/O driver 29 and performs error correction on the data read to produce error-corrected data. Further, the controller 25 stores the error-corrected data into the buffer memory 27 and transfers error-corrected data, read from the buffer memory 27, to the computer 22 as an external unit via the interface circuit 28 in accordance with a command from the microprocessor 26. The corrected data may be supplied to, for example, an image data processing apparatus as well as the computer 22.

Figure 9:
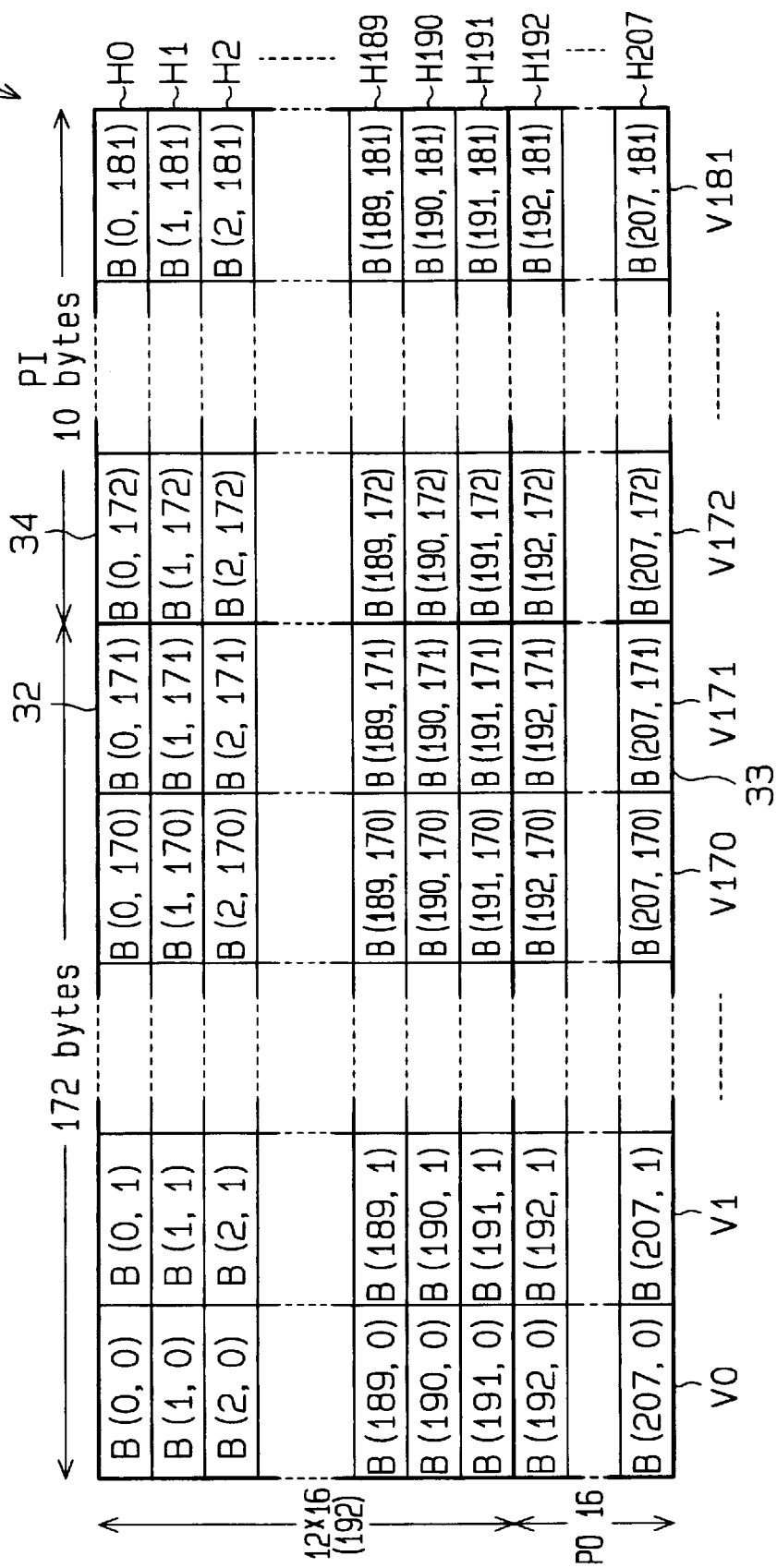
FIG. 9 shows the details of data in a data portion and first and second ECC portions.

Data recorded on the DVD 24 will now be discussed. The DVD 24 has a huge record capacity and a relatively high frequency of occurrence of errors in data read. The errors may be originated from a defective disk produced and some stain adhered to the disk's surface. As shown in FIG. 9, a block data 31 recorded on the DVD 24 includes information symbols (data portion) 32, first ECCs (first ECC portion) 33 and second ECCs (second ECC portion) 34.

Figure 10:
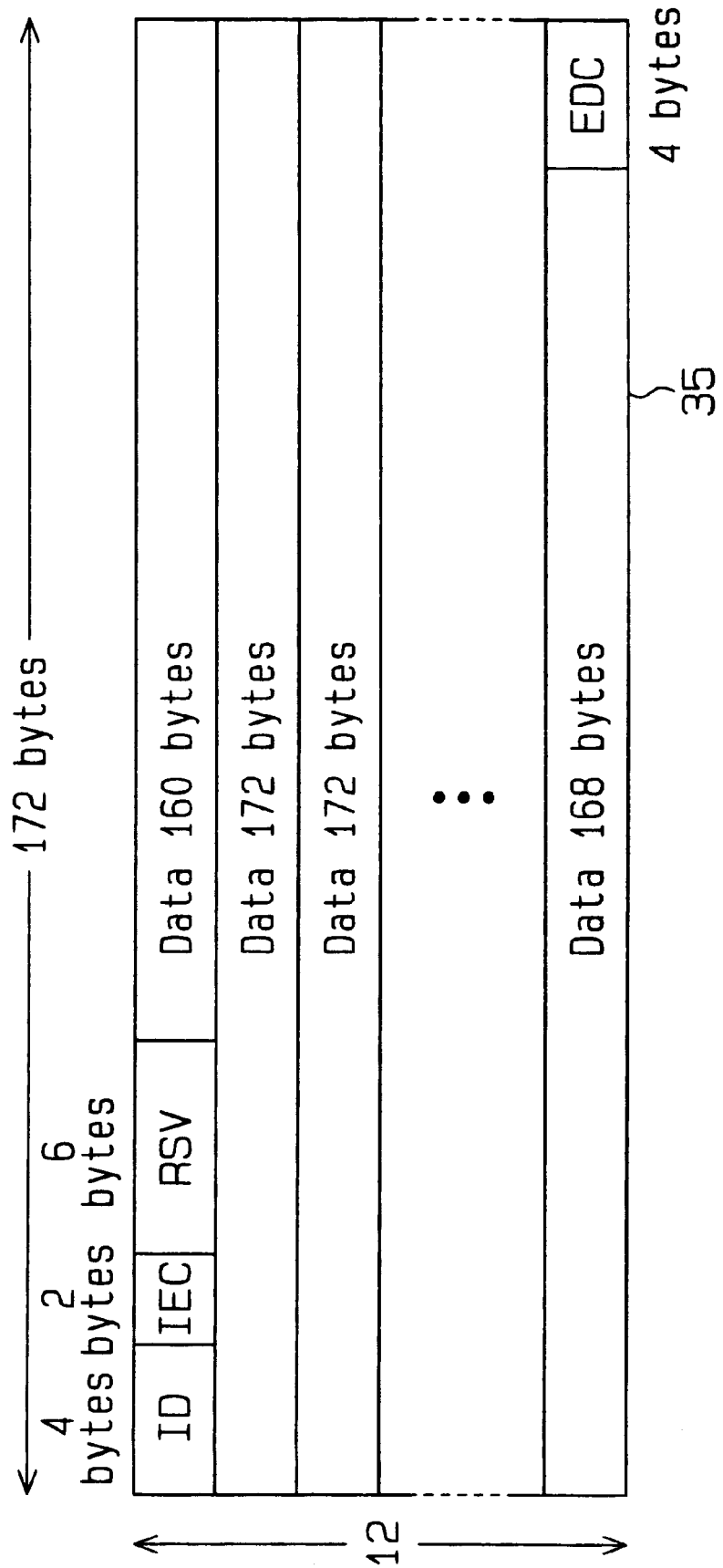
FIG. 10 depicts the detailed format of one data sector in the data portion in FIG. 9.

The data portion 32 is separated into a plurality of data sectors (sixteen data sectors in this embodiment). As shown in FIG. 10, one data sector 35 includes 2064 bytes of data. Specifically, one data sector 35 includes 4-byte identification data ID, a 2-byte ID error detecting code IEC, a 6-byte reserve area RSV, 2048 (2 K) bytes of data DATA and a 4-byte error detecting code EDC. Thus, the data portion 32 includes about 33 Kbytes of data (33024 bytes=2064 bytes× 16 sectors).

Returning to FIG. 9, the data portion 32 has a matrix data structure having predetermined numbers of rows and columns (192 rows by 172 columns in this embodiment). Data in the data portion 32 is expressed as data $B(x, y)$ using a row coordinate value x ($0 \leq x \leq 191$) and a column coordinate value y ($0 \leq y \leq 171$). That is, the data portion 32 includes data $B(0, 0)$ to data $B(191, 171)$.

The first ECC portion 33 includes a plurality of ECCs (e.g., Reed-Solomon codes) which have been obtained by an operation using each column of data in each sector of the data portion 32. That is, 16-byte ECCs corresponding to the 16 sectors are produced for each column and are affixed to the associated data column in the first ECC portion 33. Each code in the first ECC portion 33 is expressed as data $B(x, y)$ using the row coordinate value x ($192 \leq x \leq 207$) and the column coordinate value y ($0 \leq y \leq 171$). That is, the first ECC portion 33 includes code data $B(192, 0)$ to code data $B(207, 171)$.

Specifically, code data $B(192, 0)$ to $B(207, 0)$ of the first column in the first ECC portion 33 are generated and affixed by an operation, which uses data $B(0, 0)$ to $B(191, 0)$ of the first column in the data portion 32. Likewise, code data $B(192, 1)$ to $B(207, 1)$ of the second column in the first ECC portion 33 are generated and affixed by operations, which use data $B(0, 1)$ to $B(191, 1)$ of the second column in the data portion 32. Similarly, the code data for the remaining columns (3–171) in the first ECC portion 33 are generated and affixed using data from corresponding columns of the data portion 32.

The second ECC portion 34 includes plural pieces of ECC data (e.g., Reed-Solomon codes) which have been obtained by an operation using each row of data in the data portion 32 and the first ECC portion 33. That is, ECCs of a predetermined number of bytes (ten bytes in this embodiment), which correspond to the data bytes (172 bytes) in each row, are produced and affixed to the associated data row in the data portion and the first ECC portion 33. Each code in the second ECC portion 34 is expressed as data $B(x, y)$ using the row coordinate value x ($0 \leq x \leq 207$) and the column coordinate value y ($172 \leq y \leq 181$). That is, the second ECC portion 34 includes code data $B(0, 172)$ to code data $B(207, 181)$.

Specifically, code data $B(0, 172)$ to $B(0, 181)$ of the first row in the second ECC portion 34 are generated and affixed by an operation, which uses data $B(0, 0)$ to $B(0, 171)$ of the first row in the data portion 32. Likewise, code data $B(1, 172)$ to $B(1, 181)$ of the second row in the second ECC portion 34 are generated and affixed by operations, which use data $B(1, 0)$ to $B(1, 171)$ of the second row in the data portion 32. Similarly, the code data for the remaining rows (3–192) in the second ECC portion 34 are generated and affixed using data from corresponding rows of the data portion 32.

Further, code data $B(192, 172)$ to $B(192, 181)$ of the 193rd row to code data $B(207, 172)$ to $B(207, 181)$ of the 208th row in the second ECC portion 34 are generated and affixed by operations, which use code data $B(192, 0)$ to $B(192, 171)$ of the 193rd row to code data $B(207, 0)$ to $B(207, 171)$ of the 208th row in the first ECC portion 33, respectively.

Alternatively, the first ECC portion may include the first ECCs that have been affixed to each row of data in the data portion 32, and the second ECC portion may include the second ECCs that have been affixed to data in the data portion 32 and the code data in the first ECC portion.

The controller 25 in FIG. 2 performs first error correction using each row of data in the block data 31 first, and then performs second error correction using each column of data. Each row of data includes data which is data in the data portion 32 coupled to code data in the second ECC portion 34, or data which is code data in the first and second ECC portions 33 and 34 coupled together. Each column of data includes data which is data in the data portion 32 coupled to code data in the first ECC portion 33, or data in the second ECC portion 34.

Each row of data and each column of data, which are used in the first and second error corrections, are treated as code words. Hereinafter, the term "interleave" will be used in place of "code word" in this specification. Further, the terms "row interleave" and "column interleave" will hereinafter be used to distinguish the interleave in each row from the interleave in each column.

As shown in FIG. 9, the block data 31 includes 208 row interleaves H0 to H207. The row interleave H0 includes data $B(0, 0)$ to $B(0, 181)$ in the first row. The row interleaves H1 to H207 respectively include data $B(1, 0)$ to $B(1, 181)$ in the second row to data $B(207, 0)$ to $B(207, 181)$ in the 208th row. The block data 31 further includes 182 column interleaves V0 to V181. The column interleave V0 includes data $B(0, 0)$ to $B(207, 0)$ in the first column. The column interleaves V1 to V181 respectively include data $B(0, 1)$ to $B(207, 1)$ in the second column to data $B(0, 181)$ to $B(207, 181)$ in the 208th column.

The controller 25 generates error syndromes using individual row interleaves H0 to H207 first, and then acquires a polynomial for an error position and a polynomial for an error value. To acquire those polynomials, for example, a Euclidean algorithm is used. The controller 25 further computes an error position and an error value using the error position polynomial and the error value polynomial. The Chien algorithm (Chien search) may be used in this computation. Then, the controller 25 executes the second error correction for the row interleave that is associated with the computed error position using the error value.

Figure 11:
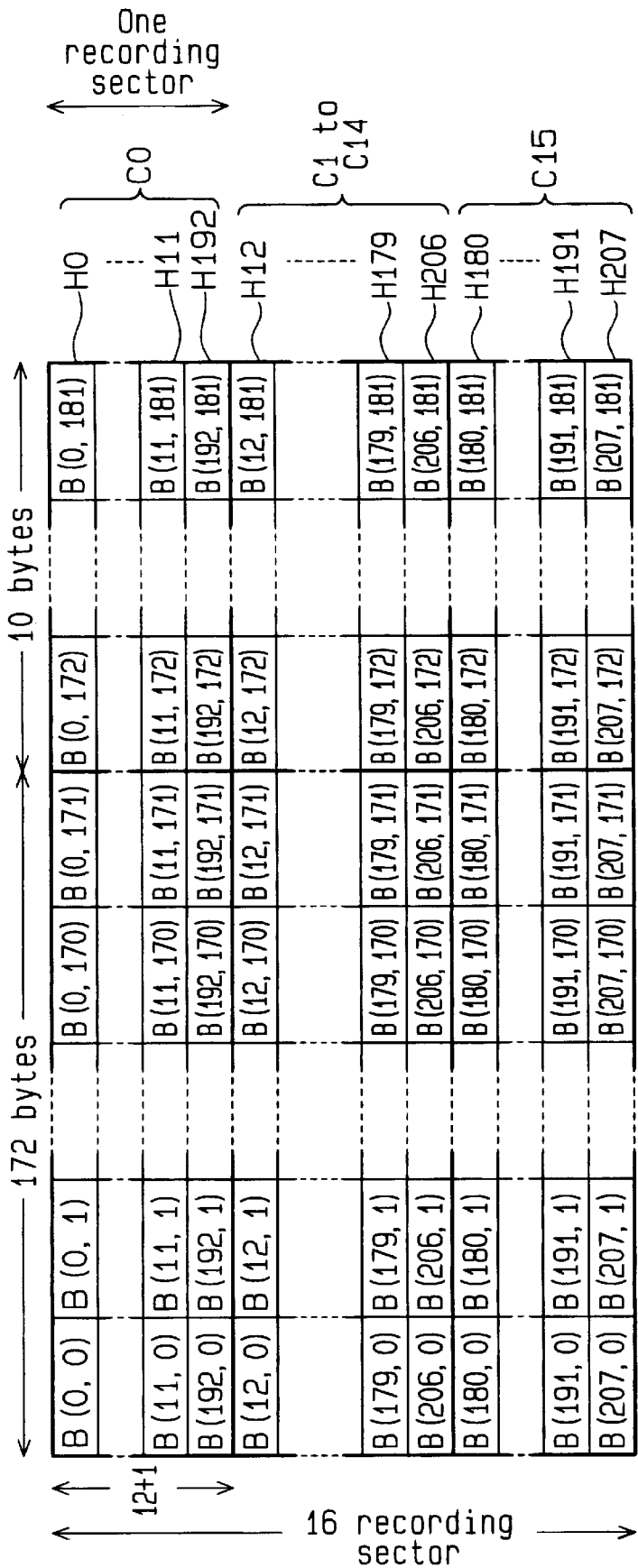
FIG. 11 shows the details of data recorded sector by sector on a DVD.

Actually, a block data 31 is recorded on the DVD 24 as shown in FIG. 11. The row interleaves associated with the data portion 32 are divided into sixteen groups each consisting of twelve row interleaves. The row interleaves associated with the first ECC portion 33 are divided into sixteen groups row by row. A single divided row interleave is inserted between groups each consisting of twelve row interleaves. Accordingly, sixteen recording sectors (clusters) C0 to C15 each including thirteen row interleaves are formed. Thus, the block data 31 consists of the sixteen clusters C0–C15. For example, the cluster C0 consists of the row interleaves H0–H11 and the inserted row interleave H192. The cluster C15 consists of the row interleaves H180–H191 and the inserted row interleave H207.

Data recorded on the DVD 24 is sequentially read starting from the cluster C0. Specifically, as shown in FIG. 11, the first row interleave H0 to the twelfth row interleave H11 are read first, and then the inserted, thirteenth row interleave H192 is read out. The clusters C1–C15 are sequentially read in this manner.

The controller 25 receives the row interleaves H0–H11 and H192 in the cluster C0 in the reading order. First, the controller 25 generates the syndrome of the row interleave H0 and performs the first error correction on the row interleave H0 using that syndrome. The controller 25 temporarily stores the error-corrected row interleave H0 in the external buffer memory 27, which has a memory capacity large enough to store plural pieces of block data 31.

Then, the controller 25 generates syndromes for the respective row interleaves H1–H11 and H192 and performs the first error correction on them. The error-corrected row interleaves H1–H11 and H192 are temporarily stored in the external buffer memory 27. Likewise, the controller 25 sequentially receives the clusters C1 to C15 and performs the first error correction for the individual row interleaves in each of the clusters C1–C15.

The controller 25 sorts the inserted row interleaves at the same time as it performs the first error correction. For example, the row interleaves H0–H11 in the cluster C0 are stored in the external buffer memory 27 as the first to twelfth row interleaves, and the row interleave H192 is stored in the external buffer memory 27 as the 193rd row interleave. In this manner, the block data 31 or the row interleaves H0–H207 are stored in the external buffer memory 27 when the first error correction has completed.

Next, the controller 25 receives a predetermined number of column interleaves corresponding to the data bus width of the external buffer memory 27 and performs the second error correction for the individual column interleaves in parallel. The column interleaves V0–V181 respectively include data B(0, 0) to B(207, 0) to data B(0, 181) to B(207, 181) which are each one byte (eight bits). According to this embodiment, therefore, the data bus width of the external buffer memory 27 is set to a plurality of bytes (an integer multiple of eight bits).

Suppose that the external buffer memory 27 has a data bus width of two bytes (sixteen bits). In this case, the controller 25 receives the data B(0, 0) and data B(0, 1) in two column interleaves V0 and V1 from the buffer memory 27 in unit of a byte. Next, the controller 25 receives the data B(1, 0) and data B(1, 1) in the column interleaves V0 and V1. Then, the controller 25 receives in like order the data B(2, 0) and B(2, 1) through the data B(207, 0) and B(207, 1) in the column interleaves V0 and V1. The unit of data which is read from the external buffer memory 27 is not limited to one byte but may be a plurality of bytes.

The controller 25 executes the second error correction on the individual column interleaves V0 and V1 in parallel using the read data B(0, 0) and B(0, 1), B(1, 0) and B(1, 1) and so forth to B(207, 0) and B(207, 1). That is, the generation of a syndrome of the column interleave V0 using the data B(0, 0) to B(207, 0) and the generation of a syndrome of the column interleave V1 using the data B(0, 1) to B(207, 1) are executed in parallel.

As apparent from the above, the controller 25 simultaneously receives a plurality of column interleaves corresponding to the data bus width of the external buffer memory 27 and executes the second error correction on the individual column interleaves in parallel. This scheme reduces the number of readings or the number of accesses to the external buffer memory 27 as compared with the prior art, which reads a single column interleave from the external buffer memory 27. When the external buffer memory 27 has a data bus width of two bytes as in the above-described case, the number of accesses becomes a half the number of accesses in the prior art. When the data bus width is four bytes, the number of accesses becomes a quarter of the conventional number of accesses. The reduction in the number of accesses for the second error correction reduces the load on the external buffer memory 27 and permits the number of accesses for data storage and data supply to the computer 22 after the first error correction to be increased. As a result, fast data reading is effectively accomplished and the time required for error correction using the buffer memory 27 is shortened.

Figure 3:
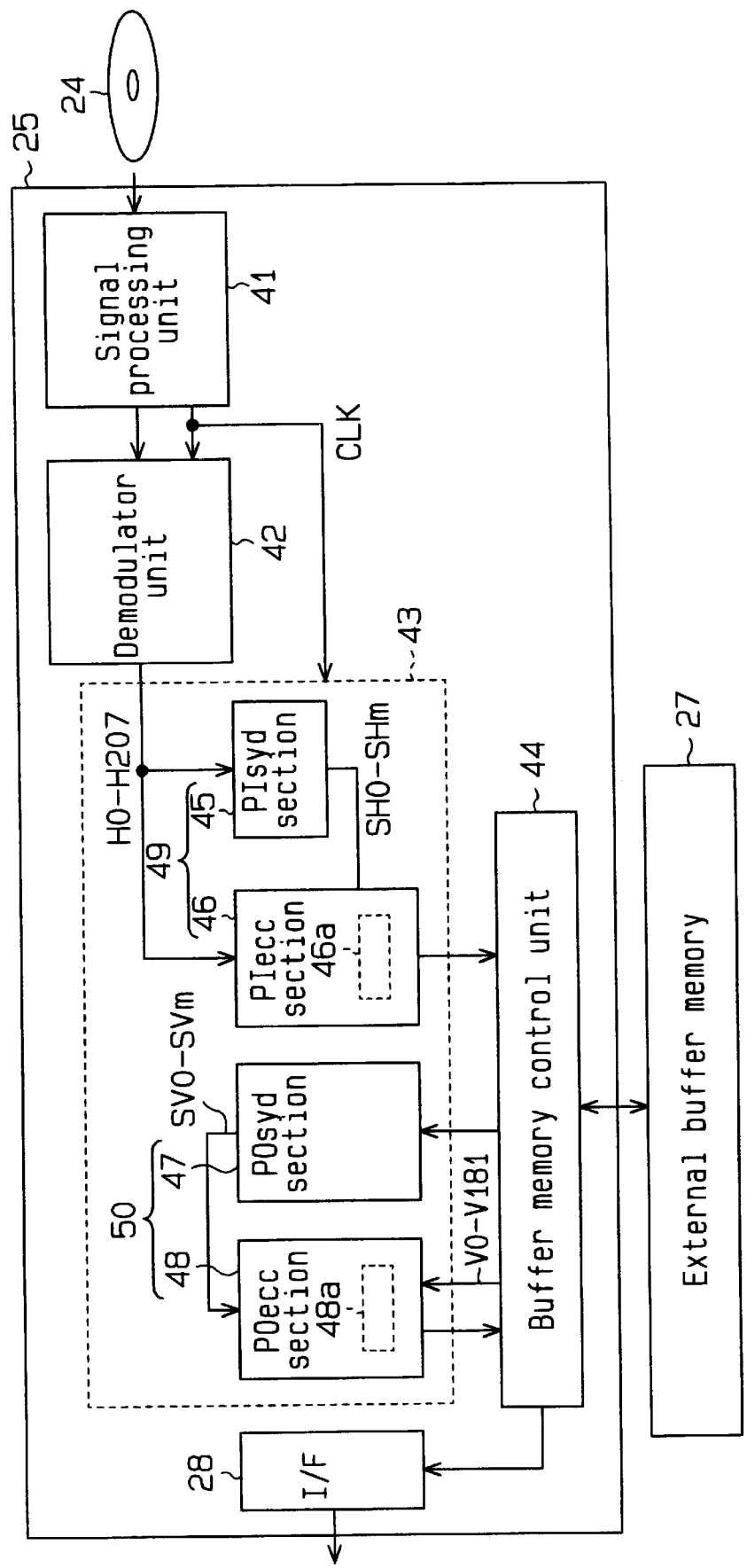
FIG. 3 is a block diagram depicting an optical disk controller according to the first embodiment of the invention, which is incorporated in the optical disk control unit in FIG. 2.

As shown in FIG. 3, the controller 25 includes a signal processing unit 41, a demodulator unit 42, an error correcting circuit unit 43 and a buffer memory control unit 44. The signal processing unit 41 receives analog data read from the DVD 24, converts the analog data to digital data and generates a clock signal CLK synchronous with the digital data. The signal processing unit 41 supplies the digital data to the demodulator unit 42 and the clock signal CLK to the demodulator unit 42 and the error correcting circuit unit 43.

The demodulator unit 42 operates in synchronism with the clock signal CLK from the signal processing unit 41 and demodulates the digital data from the signal processing unit 41 in accordance with a predetermined system (e.g., EFM (Eight-to-Fourteen Modulation) plus system). The demodulator unit 42 sends the demodulated digital data to the error correcting circuit unit 43.

The error correcting circuit unit 43 includes a PI syndrome generating (PIsyd) section 45, PI error correction (PIecc) section 46, PO syndrome generating (POsyd) section 47 and PO error correction (POecc) section 48. The PIsyd section 45 and the PIecc section 46 form a row data error correcting circuit 49, which executes error correction on the individual row interleaves H0–H207 in the block data 31. The POsyd section 47 and the POecc section 48 form a column data error correcting circuit 50, which executes error correction on the individual column interleaves V0–V181 in the block data 31.

The PIsyd section 45 sequentially receives the row interleaves H0–H207 from the demodulator unit 42 and generates their syndromes. The PIsyd section 45 supplies the generated syndromes to the PIecc section 46.

Figure 4:
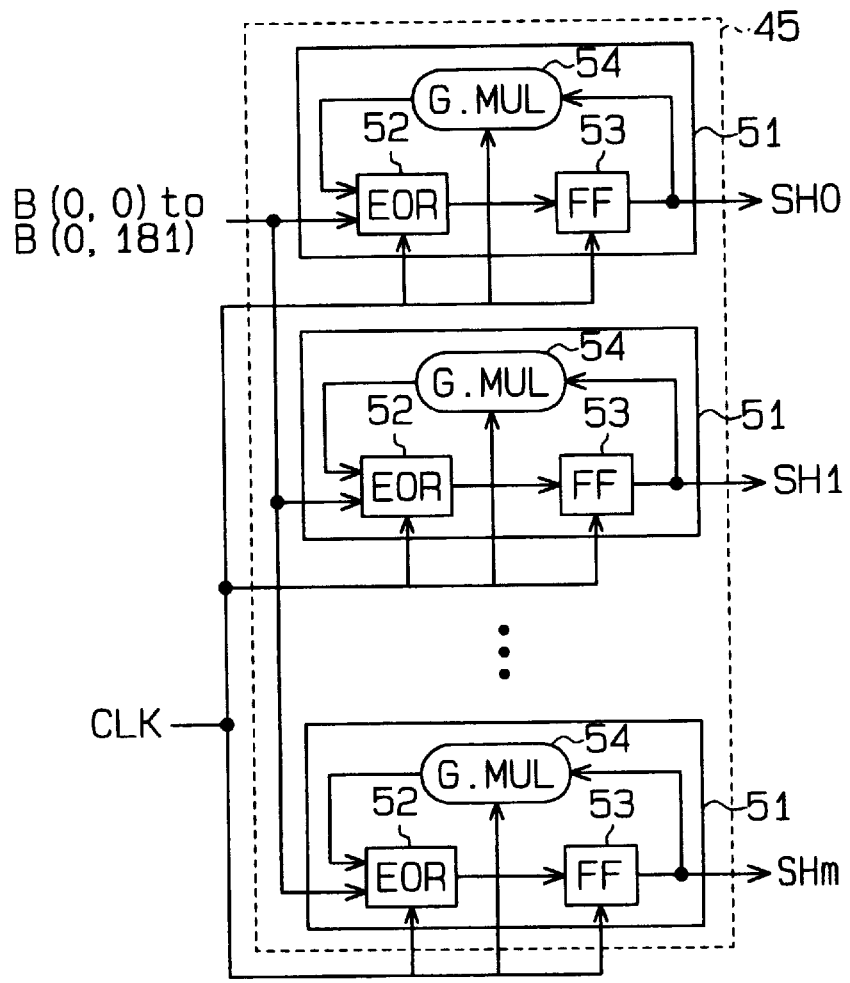
FIG. 4 is a block diagram showing a PI syndrome generating section incorporated in the optical disk controller in FIG. 2.
Figure 5:
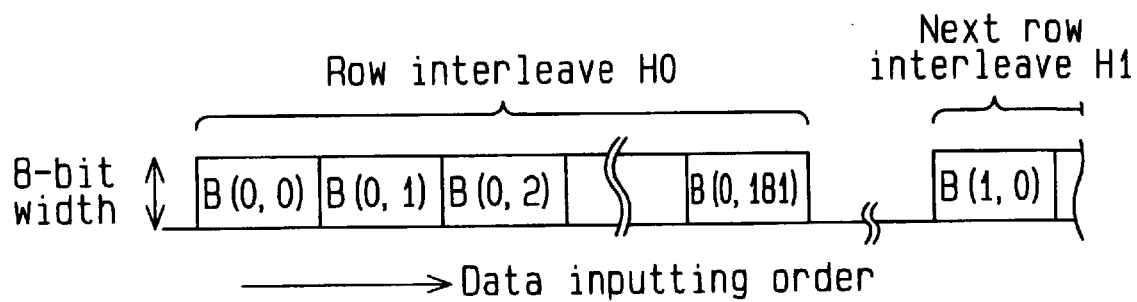
FIG. 5 shows the order of data supplied to the PI syndrome generating section.

As shown in FIG. 4, the PIsyd section 45 includes a plurality of syndrome computing units 51. The number of the syndrome computing units 51 corresponds to a predetermined number of pieces of syndrome data to be generated. Each syndrome computing unit 51 includes an exclusive OR (EOR) gate 52, an 8-bit flip-flop circuit (FF) 53, and a multiplier (G. MUL) 54. The multiplier 54 performs multiplication of data using a predetermined multiplier factor of a Galois field. The value of the multiplier factor previously set in one syndrome computing unit 51 to generate syndrome data differs from the value of the preset multiplier factor in another syndrome computing unit 51. As shown in FIG. 5, the individual EOR gates 52 sequentially receive, for example, the data B(0, 0) to B(0, 181) in the row interleave H0 in synchronism with the clock signal CLK. That is, the individual EOR gates 52 receive the data B(0, 0), for example, almost simultaneously.

Referring again to FIG. 3, the PIecc section 46 receives the syndromes from the PIsyd section 45 and acquires an error position polynomial and an error value polynomial using a Euclidean algorithm. The PIecc section 46 then computes an error position and an error value from the error position polynomial and the error value polynomial using the Chien algorithm (Chien search).

The PIecc section 46 has an internal buffer memory 46a with an enough capacity to store one row interleave. The PIecc section 46 sequentially receives the row interleaves H0–H207 from the demodulator unit 42 and stores them one by one in the internal buffer memory 46a. The PIecc section 46 corrects an error in the row interleave stored in the internal buffer memory 46a in accordance with the error position and the error value, and sends the error-corrected row interleave to the buffer memory control unit 44.

The buffer memory control unit 44 controls data writing to, or data reading from, the external buffer memory 27 in response to instructions from the PIecc section 46, the POsyd section 47, the POecc section 48 and the interface circuit 28.

Figure 8:
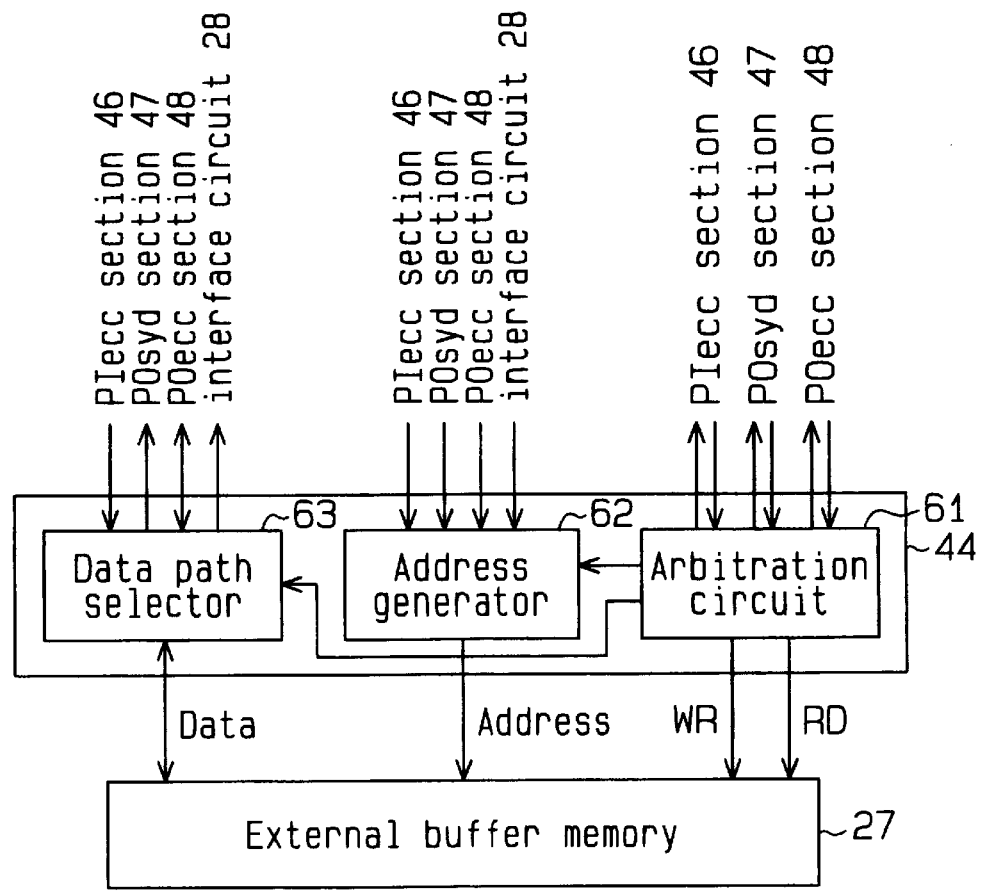
FIG. 8 is a block diagram showing a buffer memory control unit incorporated in the optical disk controller in FIG. 2.

As shown in FIG. 8, the buffer memory control unit 44 includes an arbitration circuit 61, an address generator 62 and a data path selector 63. The arbitration circuit 61 selects a path for data reading or data writing. In this embodiment, there are the following four paths:

1) A path for writing data from the PIecc section 46 into the buffer memory 27,
2) A path for supplying data to the POsyd section 47 and POecc section 48 from the buffer memory 27,
3) A path for writing data from the POecc section 48 to the buffer memory 27, and
4) A path for supplying data to the interface circuit 28 from the buffer memory 27.

Every time data is acquired from the DVD 24, the arbitration circuit 61 selects a single path and sends a read/write control signal RD/WR for the selected path to the external buffer memory 27.

The address generator 62 generates an address signal for the data to be written in or to be read from the external buffer memory 27 in accordance with data or instructions from the sections associated with the selected path, and sends the address signal to the external buffer memory 27. This address generator 62 may be incorporated in any one of the PIecc section 46, POsyd section 47, POecc section 48 and interface circuit 28.

The data path selector 63 serves to connect those sections associated with the selected path to the data bus of the external buffer memory 27.

The arbitration circuit 61 selects the path to the PIecc section 46 first. Then, the address generator 62 generates a write address signal for the row interleaves H0–H207, and sends this address signal to the external buffer memory 27.

The data path selector 63 receives the row interleaves H0–H207 from the PIecc section 46 and supplies them to the external buffer memory 27. As a result, the row interleaves H0–H207 which have undergone the first error correction are written in a predetermined memory area in the external buffer memory 27 in accordance with the address signal.

The microprocessor 26 receives a signal representing the end of the first error correction for the row interleaves H0–H207 from the PIecc section 46, and sends a signal indicating the permission of the second error correction on the column interleaves V0–V181 to the POsyd section 47 and the POecc section 48. Then, the POsyd section 47 and the POecc section 48 send read instructions to the buffer memory control unit 44.

The POsyd section 47 receives the column interleaves V0–V181 as one set (i.e., pair) and generates syndromes of two column interleaves. This set of syndromes is also supplied to the POecc section 48. That is, the POsyd section 47 has a data bus width of two bytes capable of receiving one set of column interleaves in parallel. In other words, the data bus provided between the POsyd section 47 and the buffer memory control unit 44 has a 2-byte width which permits one set of column interleaves to be transferred.

Figure 7:
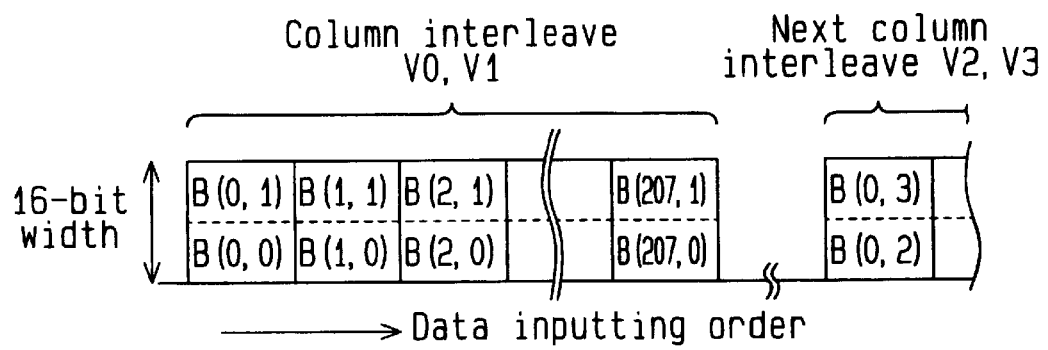
FIG. 7 shows the order of data supplied to the PO syndrome generating section.

As shown in FIG. 7, for example, the POsyd section 47 first receives the data B(0, 0) to B(207, 0) of the column interleave V0 and the data B(0, 1) to B(207, 1) of the column interleave V1 in parallel from the external buffer memory 27 via the buffer memory control unit 44. Specifically, the POsyd section 47 first receives the data B(0, 0) of the column interleave V0 and the data B(0, 1) of the column interleave V1 in parallel, and then receives the data B(1, 0) and the data B(1, 1) in parallel. The POsyd section 47 further receives the column interleaves V2 and V3 following the column interleaves V0 and V1.

Figure 6:
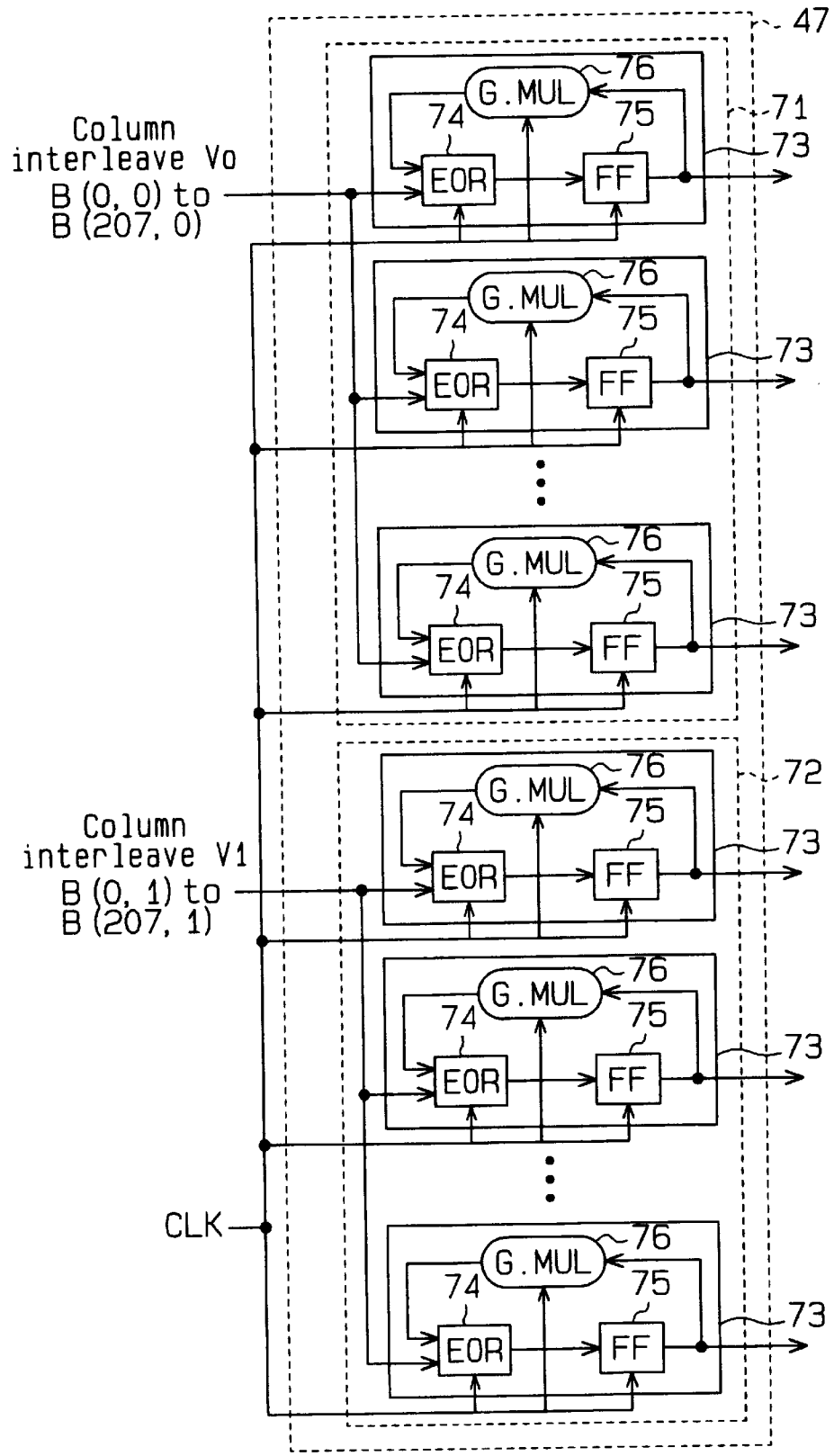
FIG. 6 is a block diagram showing a PO syndrome generating section incorporated in the optical disk controller in FIG. 2.

As shown in FIG. 6, the Posyd section 47 includes two syndrome generators 71 and 72 in association with one set of column interleaves. Each syndrome generator 71 or 72 includes a plurality of syndrome computing units 73 whose number corresponds to a predetermined number of pieces of syndrome data to be generated. Each syndrome computing unit 73 includes an EOR gate 74, an 8-bit flip-flop circuit (FF) 75, and a multiplier (G. MUL) 76. The multiplier 76 performs multiplication of data using a predetermined multiplier factor of a Galois field.

The EOR gates 74 in the syndrome computing units 73 in the syndrome generator 71 sequentially receive, for example, the data B(0, 0) to B(207, 0) in the column interleave V0 in synchronism with the clock signal CLK. That is, the individual EOR gates 74 in the syndrome generator 71 receive the data B(0, 0), for example, almost simultaneously. The individual syndrome computing units 73 generate syndromes using the data B(0, 0) to B(207, 0) in synchronism with the clock signal CLK and send the syndromes to the POecc section 48.

The EOR gates 74 in the syndrome computing units 73 in the syndrome generator 72 sequentially receive, for example, the data B(0, 1) to B(207, 1) in the column interleave V1 in synchronism with the clock signal CLK. That is, the individual EOR gates 74 in the syndrome generator 72 receive the data B(0, 1), for example, almost simultaneously. The individual syndrome computing units 73 generate syndromes using the data B(0, 1) to B(207, 1) in synchronism with the clock signal CLK and send the syndromes to the POecc section 48.

Referring again to FIG. 3, the POecc section 48 receives the syndromes from the POsyd section 47 and acquires an error position polynomial and an error value polynomial using a Euclidean algorithm. The POecc section 48 then computes an error position and an error value from the error position polynomial and the error value polynomial using the Chien algorithm (Chien search).

The POecc section 48 has an internal buffer memory 48$a$ with an enough capacity to store plural sets of error positions and error values. The number of pieces of correctable data with respect to a single interleave is limited to a predetermined number. According to this embodiment, therefore, the internal buffer memory 48$a$ has a capacity enough to store sets of error positions and error values whose quantity correspond to the number of pieces of correctable data with respect to a single interleave.

The POecc section 48 stores plural sets of error positions and error values, which are used in correcting errors of one column interleave, into the internal buffer memory 48$a$. In accordance with each error position, the POecc section 48 reads data in the associated column interleave from the external buffer memory 27 and performs an EOR operation on data and the error value, both associated with the error position, to correct an error in the data. The error-corrected data is stored in the internal buffer memory 48$a$. In accordance with the address corresponding to the error position, the POecc section 48 rewrites the erroneous data stored in the external buffer memory 27 to the error-corrected data stored in the internal buffer memory 48$a$. In this manner, the second error correction is performed on all the row interleaves V0–V181.

The microprocessor 22 receives a signal indicating the end of the second error correction from the POecc section 48 and sends a signal indicating a read permission to the interface circuit 28. Then, the interface circuit 28 supplies a read instruction to the buffer memory control unit 44 in response to that signal.

In accordance with the instruction from the interface circuit 28, the buffer memory control unit 44 reads the data portion 32 in one block data 31 from the external buffer memory 27 and supplies it to the interface circuit 28. Upon reception of the data portion 32, the interface circuit 28 converts each data in the data portion 32 to have a predetermined format and sends the converted data to the computer 22 via an interface (not shown).

According to the first embodiment, as described above, the external buffer memory 27 has a 2-byte data bus width. The buffer memory control unit 44 reads one set (pair) of column interleaves from the external buffer memory 27 and supplies them to the POsyd section 47 in the second error correction. The POsyd section 47 generates syndromes from the set of column interleaves in parallel, and performs error correction on both of the column interleaves of the set using both syndromes. Such processing reduces the number of readings of the column interleaves V0–V181 for the second error correction or the number of accesses to the external buffer memory 27. Therefore, fast access to the external buffer memory 27 is accomplished so that data is read fast from the DVD 24.

Second Embodiment

An optical disk control unit according to the second embodiment of this invention will now be described referring to the accompanying drawings. To avoid the redundant description, like or same reference numerals are given to those components which are the same as the corresponding components of the first embodiment.

Figure 12:
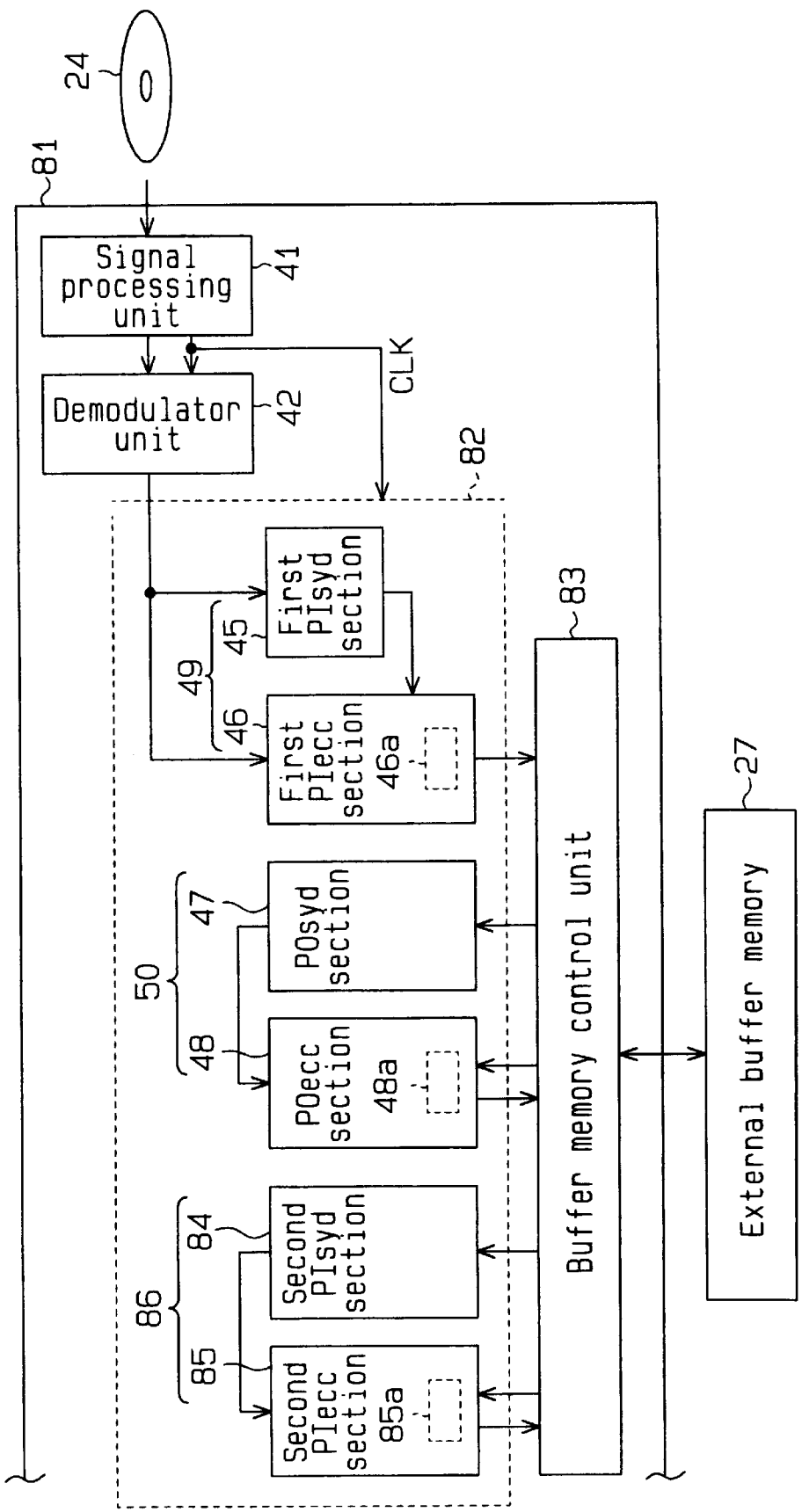
FIG. 12 is a block diagram illustrating a part of an optical disk controller according to the second embodiment of the invention.

As shown in FIG. 12, an optical disk control unit 81 according to the second embodiment includes a signal processing unit 41, a demodulator unit 42, an error correcting circuit 82, a buffer memory control unit 83 and an interface circuit 28 (not shown). The error correcting circuit 82 includes a first PI syndrome generating (first PIsyd) section 45, a first PI error correction (first PIecc) section 46, a PO syndrome generating (POsyd) section 47, a PO error correction (POecc) section 48, a second PI syndrome generating (second PIsyd) section 84, and a second PI error correction (second PIecc) section 85.

The buffer memory control unit 83 receives instructions from the individual sections 46–48, 84 and 85 and the interface circuit 28, and controls data writing to, or data reading from, the external buffer memory 27 in accordance with the individual instructions.

The second PIsyd section 84 and the second PIecc section 85 perform the first error correction again after the second error correction is executed by the column data error correcting circuit 50. Therefore, the first PIsyd section 45 and the first PIecc section 46 form a first row data error correcting circuit 49, and the second PIsyd section 84 and the second PIecc section 85 form a second row data error correcting circuit 86.

Figure 14:
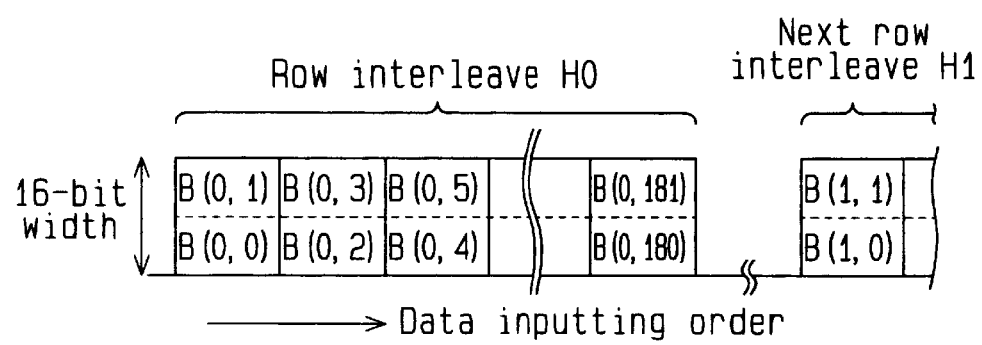
FIG. 14 shows the order of data supplied to the second PI syndrome generating section.

As shown in FIG. 14, the second PIsyd section 84 receives the data B(0, 0) and B(0, 1) in the row interleave H0 first from the external buffer memory 27 having a 2-byte bus width, and then receives the data B(0, 2) and B(0, 3). After the data B(0, 206) and B(0, 207) in the row interleave H0 are supplied in this manner, the data in the next row interleave H1 is successively supplied in the units of two bytes.

Figure 13:
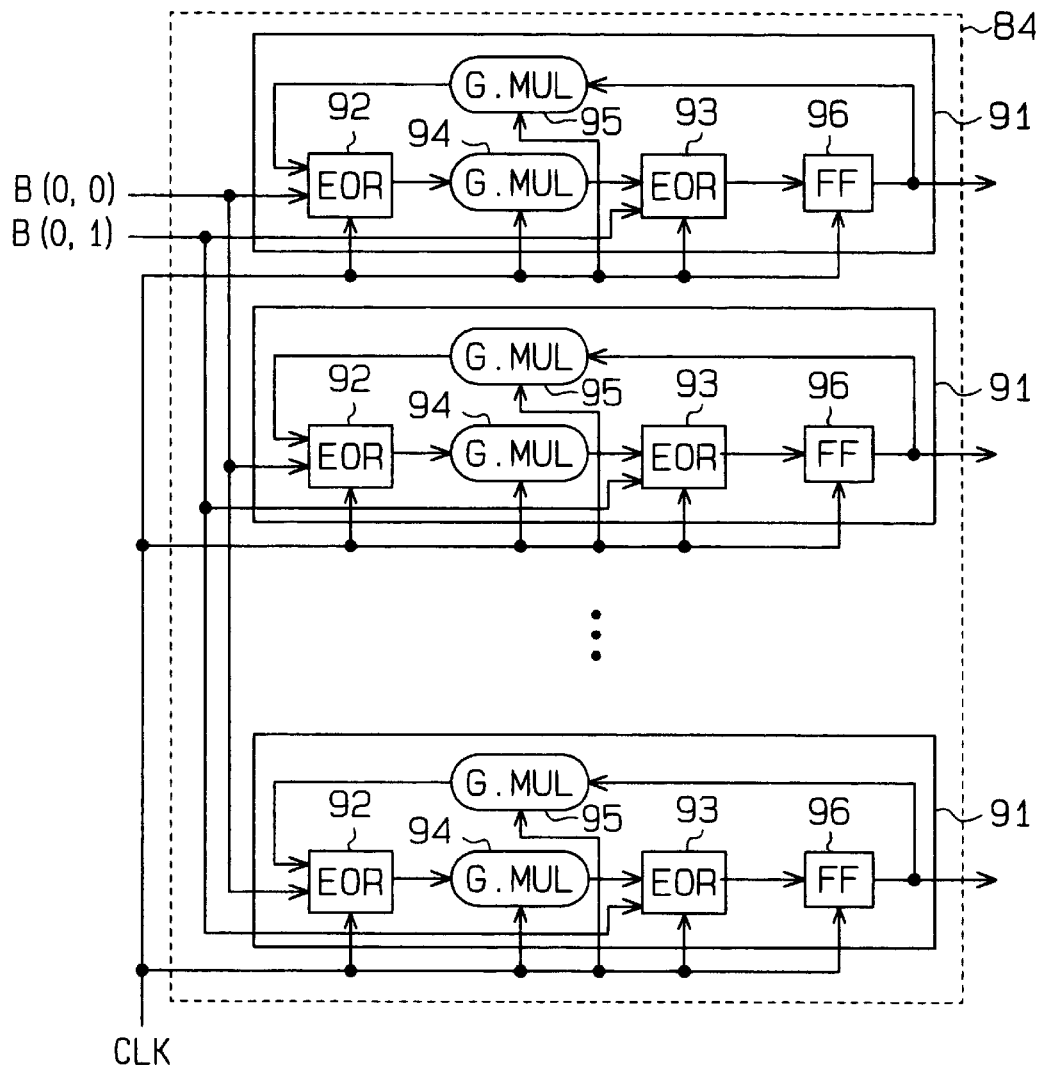
FIG. 13 is a block diagram showing a second PI syndrome generating section incorporated in the optical disk controller in FIG. 12.

As shown in FIG. 13, the second PIsyd section 84 includes syndrome computing units 91 whose number corresponds to the number of pieces of syndrome data to be generated. Each syndrome computing unit 91 includes first and second EOR gates 92 and 93, first and second multipliers (G. MUL) 94 and 95 and an 8-bit flip-flop circuit (FF) 96.

The values of the multiplier factors of Galois fields previously set in both multipliers 94 and 95 in each syndrome computing unit 91 are the same. However, the values of the multiplier factors previously set in both multipliers 94 and 95 in one syndrome computing unit 91 to generate syndrome data differ from those of the preset multiplier factors in both multipliers 94 and 95 in another syndrome computing unit 91. An initial value of "0" is set in each FF 96 before an arithmetic operation of the row interleave H0 starts.

In each syndrome computing unit 91, the first EOR gate 92 receives the data B(0, 0) in the row interleave H0 and the second EOR gate 93 receives the data B(0, 1) in the row interleave H0 both in synchronism with the clock signal CLK.

The first EOR gate 92 then receives the next data B(0, 2) in the row interleave H0 and the initial value "0" output from the second G. MUL 95. The second EOR gate 93 receives the result of an arithmetic operation on the next data B(0, 3) in the row interleave H0 and the data B(0, 1) output from the first G. MUL 94.

The first G. MUL 94 sequentially performs arithmetic operations on the data B(0, 0), B(0, 2), . . . , and B(0, 180), and the second G. MUL 95 sequentially performs arithmetic operations on the data B(0, 1), B(0, 3), . . . , and B(0, 181). The operations in the first and second EOR gates 92 and 93 are executed substantially at the same time. The operations in the first and second G. MULs 94 and 95 are also executed substantially at the same time.

As discussed above, each syndrome computing unit 91 receives data in the row interleave H0 in the units of two bytes in synchronism with the clock signal CLK and performs an arithmetic operation using the data B(0, 0) to B(0, 181) in the row interleave H0 to generate a syndrome of one row interleave. This syndrome is supplied to the second PIecc section 85. Therefore, the number of accesses to the external buffer memory 27 by the second PIsyd section 84 is half the number of accesses to read data in each row interleave in unit of a byte. This can ensure fast access to the external buffer memory 27 in the case where the first error correction becomes necessary again.

The second PIecc section 85 sequentially receives the syndromes of the row interleaves H0–H207 from the second PIsyd section 84, and acquires an error position polynomial and an error value polynomial using the individual syndromes. The second PIecc section 85 then acquires an error position and an error value from the error position polynomial and the error value polynomial. The second PIecc section 85 has an internal buffer memory 85a for storing the error position and error value. In accordance with the error position, the second PIecc section 85 reads erroneous data in the associated row interleave from the external buffer memory 27 and performs an EOR operation on the error value and erroneous data to generate error-corrected data. This error-corrected data is stored in the internal buffer memory 85a. In accordance with the error position, the second Plecc section 85 rewrites the erroneous data stored in the buffer memory 27 with the error-corrected data stored in the internal buffer memory 85a.

The microprocessor 22 receives a signal indicating the end of the first error correction from the second PIecc section 85 and sends a signal indicating a read permission to the interface circuit 28. Then, the interface circuit 28 supplies a read instruction to the buffer memory control unit 44 in response to that signal.

In accordance with the instruction from the interface circuit 28, the buffer memory control unit 44 reads the data portion 32 in one block data 31 from the external buffer memory 27 and supplies it to the interface circuit 28. Upon reception of the data portion 32, the interface circuit 28 converts each data in the data portion 32 to have a predetermined format and sends the converted data to the computer 22 via an interface (not shown).

Third Embodiment

The third embodiment of this invention will now be described referring to the accompanying drawings. To avoid the redundant description, like or same reference numerals are given to those components which are the same as the corresponding components of the first embodiment.

Figure 16:
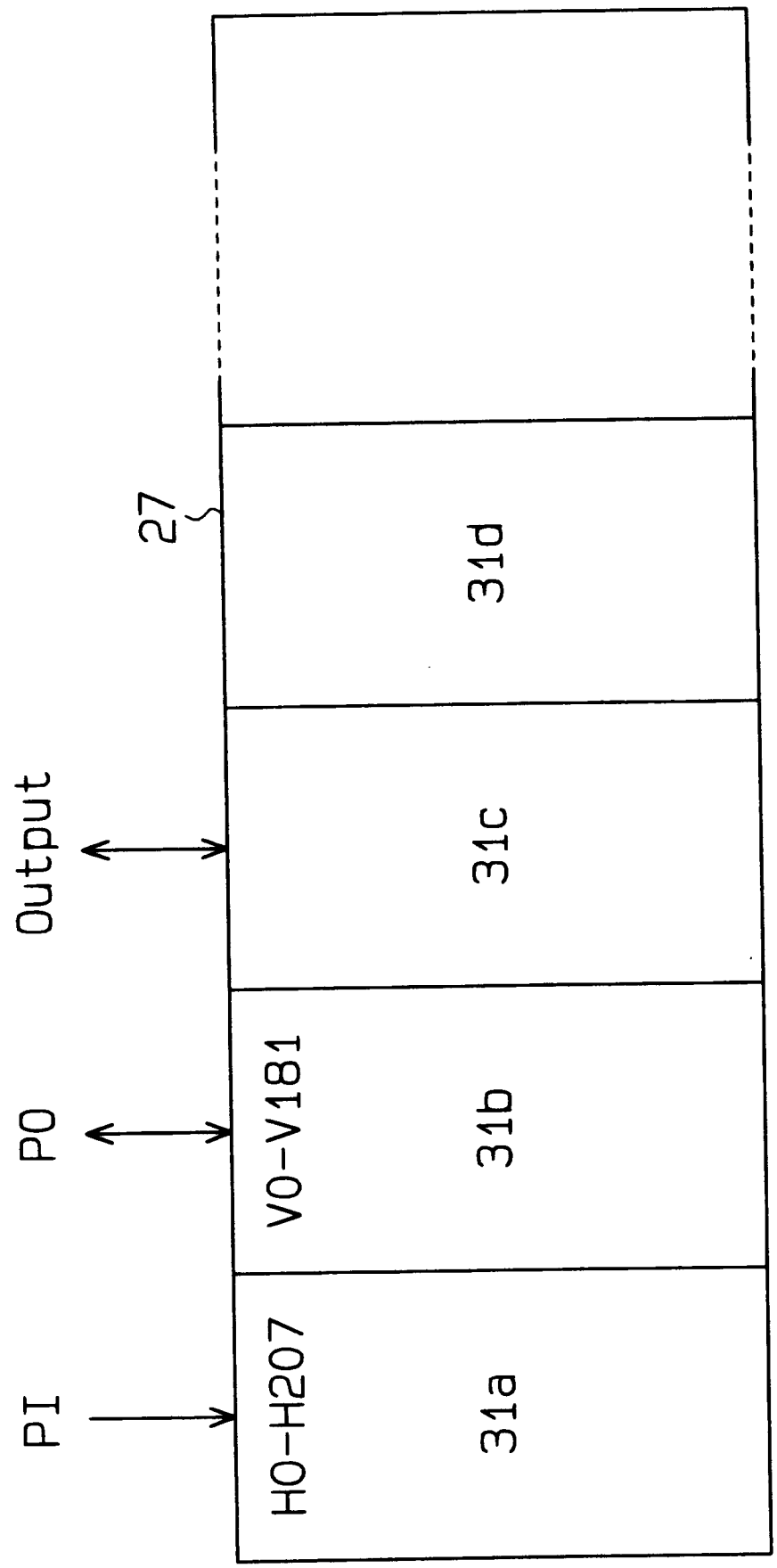
FIG. 16 illustrates data writing and reading operations that are performed between a buffer memory control section, incorporated in the optical disk controller, and the external buffer memory.

The third embodiment differs from the first embodiment in the operation of the buffer memory control unit 44. As shown in FIG. 16, the external buffer memory 27 includes a DRAM having an enough memory capacity to store plural pieces of block data 31a, 31b, 31c and so forth. The use of such a DRAM permits the external buffer memory 27 of the third embodiment to carry out reading and writing operations in fast page mode.

In the third embodiment, the buffer memory control unit 44 is designed in such a way as to access the external buffer memory 27 for data reading or writing in the data units of 16 bytes (8 words) via the selected path. Data which is written into or read from the external buffer memory 27 in the units of 16 bytes includes (1) data in the row interleaves H0–H207 which are output from the PIecc section 46, (2) data in the column interleaves V0–V181 which are exchanged between the POsyd section 47 and the Poecc section 48, and (3) data in the data portion 32 supplied to the interface circuit 28.

That is, the buffer memory control unit 44 executes the following writing and reading operations in parallel.
1) Writing one block data 31a from the PIecc section 46 into the external buffer memory 27,
2) Reading one block data 31b from the external buffer memory 27 which is to be supplied to the POsyd section 47,
3) Writing one block data 31b from the POecc section 48 into the external buffer memory 27, and
4) Reading one block data 31c in the data portion 32 from the external buffer memory 27 which is to be supplied to the interface circuit 28.

The address generator 62 (see FIG. 8) in the buffer memory control unit 44 generates addresses for the PIecc section 46, the POsyd section 47 and the POecc section 48 in such a way that a predetermined number of pieces of data are written into, and read from, the same page. For example, the address generator 62 generates addresses in such a manner that 16-byte data B(0, 0) to B(0, 15) in the row interleaves H0–H207 sequentially output from the PIecc section 46 is stored in a page area 200 (see FIG. 15). The address generator 62 further generates addresses in such a manner that 16-byte data B(0, 0) and B(0, 1) to B(7, 0) and B(7, 1) in two column interleaves are read from the same page area 200 and are supplied to the POsyd section 47 and the POecc section 48.

Figure 15:
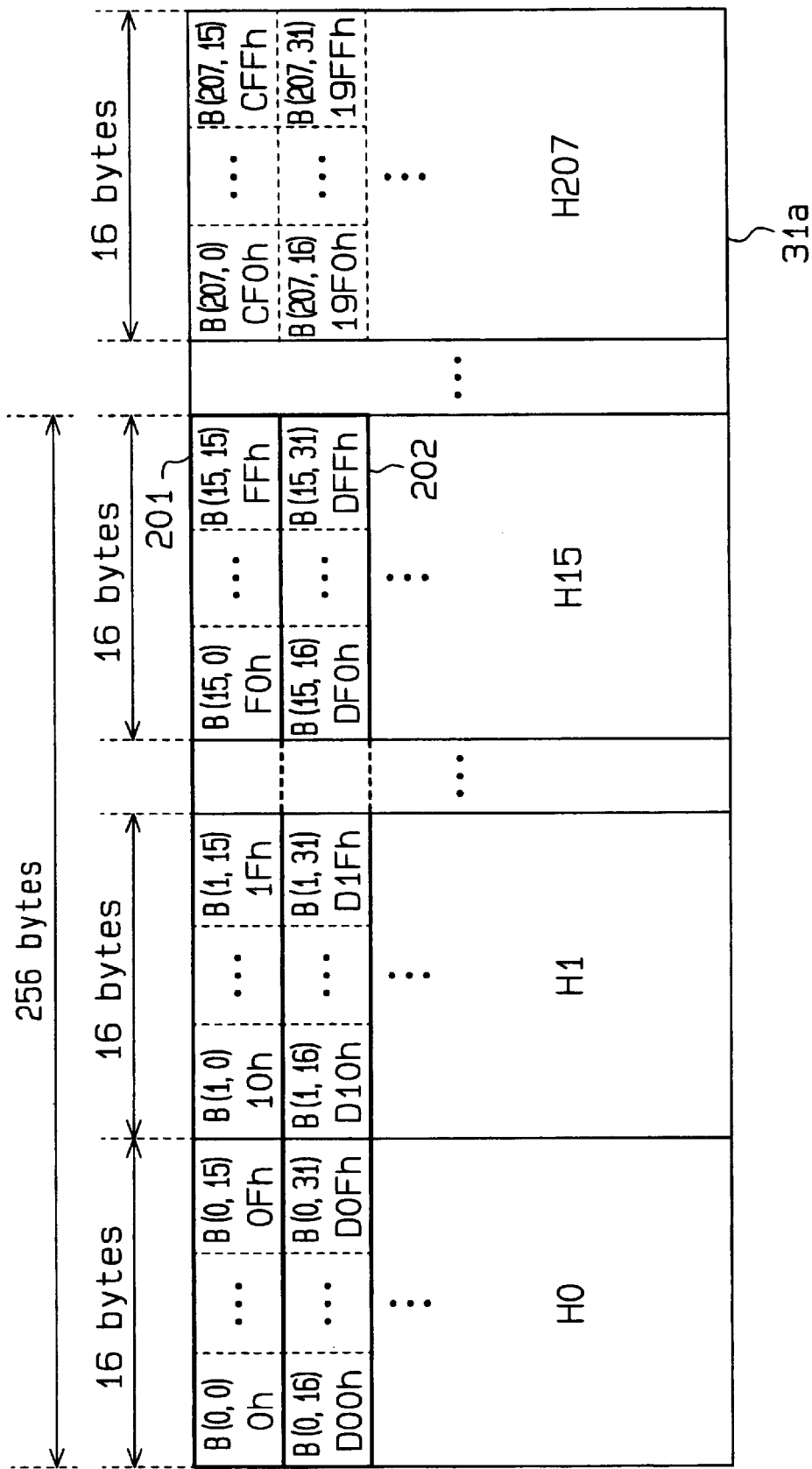
FIG. 15 shows the arrangement of data stored in an external buffer memory by an optical disk controller according to a third embodiment of the invention.

As shown in FIG. 15, the external buffer memory 27 has a plurality of page areas 200, 201 and so forth each set to the size of 256 bytes as memory areas. For instance, the first 16-byte data B(0, 0) to B(0, 15) in the row interleave H0 is stored in the page area 200 in accordance with one address "0 (0h)" to "15 (0Fh)". This address includes row and column addresses. Hereinafter, an address is expressed in a hexadecimal notation. The next 16-byte data B(0, 16) to B(0, 31) in the row interleave H0 is stored in the next page area 201 in accordance with an address "D00h" to "D0Fh". In this manner, the data B(0, 0) to B(0, 181) in the row interleave H0 are stored in the respective page areas in the units of 16 bytes. In other words, addresses are generated in such a way that the data B(0, 0) to B(0, 181) in the row interleave H0 are stored in the respective page areas, starting from the same side in every unit of 16 bytes.

The first 16-byte data B(1, 0) to B(1, 15) in the row interleave H1 is stored in the page area 200 in accordance with an address "10h" to "1Fh". Further, the first 16-byte data B(207, 0) to B(207, 15) in the row interleave H207 is stored in the associated page area in accordance with an address "CF0h" to "CFFh".

The data B(0, 0) to B(0, 15), . . . , and the data B(15, 0) to B(15, 15) in the sixteen row interleaves H0–H15 are stored in one page area 200 having 256 bytes in accordance with an address "0h" to "FFh". In this manner, data in a plurality of row interleaves are stored in one page area in the units of 16 bytes using the same row address "00". It is therefore possible to store data in a plurality of row interleaves from the PIsyd section 46 into the external buffer memory 27 using the fast page mode.

Further, stored in the page area 200 are the first 16-byte data B(0, 0) to B(0, 15) to the sixteenth 16-byte data B(15, 0) to B(15, 15) in the sixteen column interleaves V0–V15. Thus, the 16-byte data B(0, 0) and B(0, 1) to B(7, 0) and B(7, 1) in the column interleaves V0 and V1 are read at random from one page area 200. It is therefore possible to supply data in a plurality of column interleaves from one page area to the POsyd section 47 and the POecc section 48 in fast page mode.

The aforementioned data storage format is suitable for the case where data in one column interleave or data in two or more column interleaves are supplied to the POsyd section 47 and the POecc section 48 from the external buffer memory 27. In this case, the buffer memory control unit 44 accesses data in the units of 16 bytes. For example, the 16-byte data B(0, 0) to B(15, 0) in the column interleave V0 is read from one page area 200. Data read from the external buffer memory 27 in fast page mode therefore becomes possible.

According to the third embodiment, writing of the row interleaves H0–H207 and reading of the column interleaves V0–V181 can both be carried out in fast page mode. That is, the first 16-byte data in the sixteen row interleaves H0–H15 are stored in one page area 200, and the 16-byte data B(0, 0) and B(0, 1) to B(7, 0) and B(7, 1) in the two column interleaves V0 and V1 are read from that page area 200. Writing and reading of 16-byte data using the same single page area 200 are executed according to one row address. In other words, it is unnecessary to change the row address between writing and reading 16-byte data. This can ensure fast access to the external buffer memory 27 using the fast page mode.

If data is stored in the external buffer memory 27 in the format as shown in FIG. 9, data writing using the fast page mode is possible while data reading using the fast page mode is not. In the writing operation, data in each row interleave is consecutively stored in each page area in the external buffer memory 27 from the top address in the units of 16 bytes. At this time, the top data B(0, 0) in the column interleave V0 is stored at an address "0h", the data B(1, 0) at the address "0B6h" ("182"), and the data B(2, 0) at an address "16Ch" ("364"). That is, the individual pieces of data B(0, 0) to B(207, 0) in the column interleave V0 are stored at every addresses of "182". Thus, the addresses of the individual pieces of data in each column interleave are discontinuous and extend over individual pages. This makes it necessary to generate addresses for the individual pages in order to read data in the column interleave V0 of a plurality of bytes. In other words, it is necessary to generate a row address and a column address to read each piece of data. This disables the use of the fast page mode.

Figure 17:
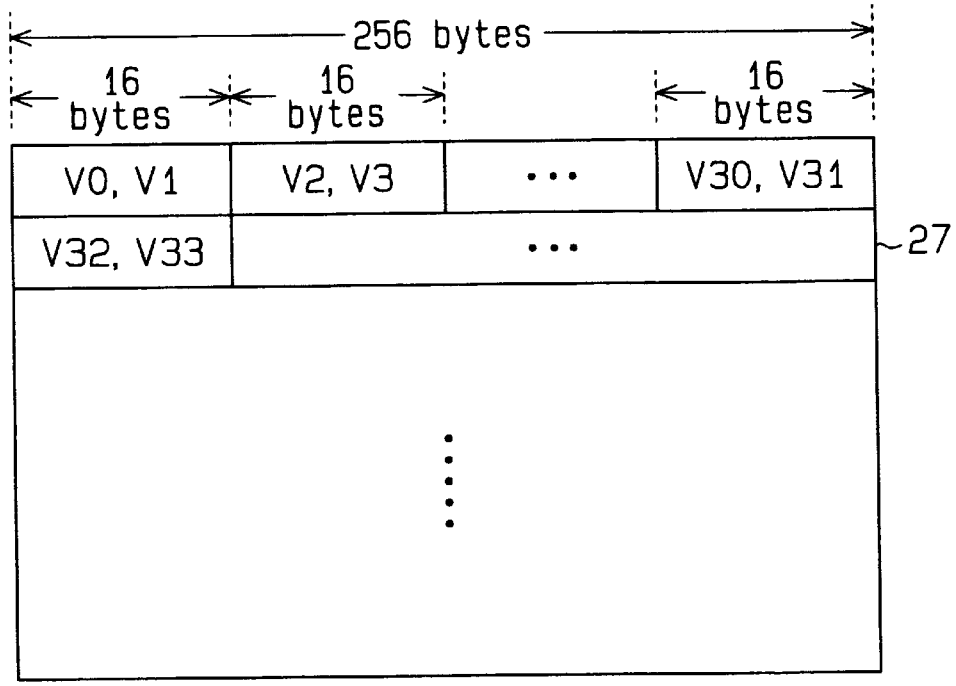
FIG. 17 shows the arrangement of data to be stored in an external buffer memory by an optical disk controller according to a modification of the third embodiment of the invention.
Figure 18:
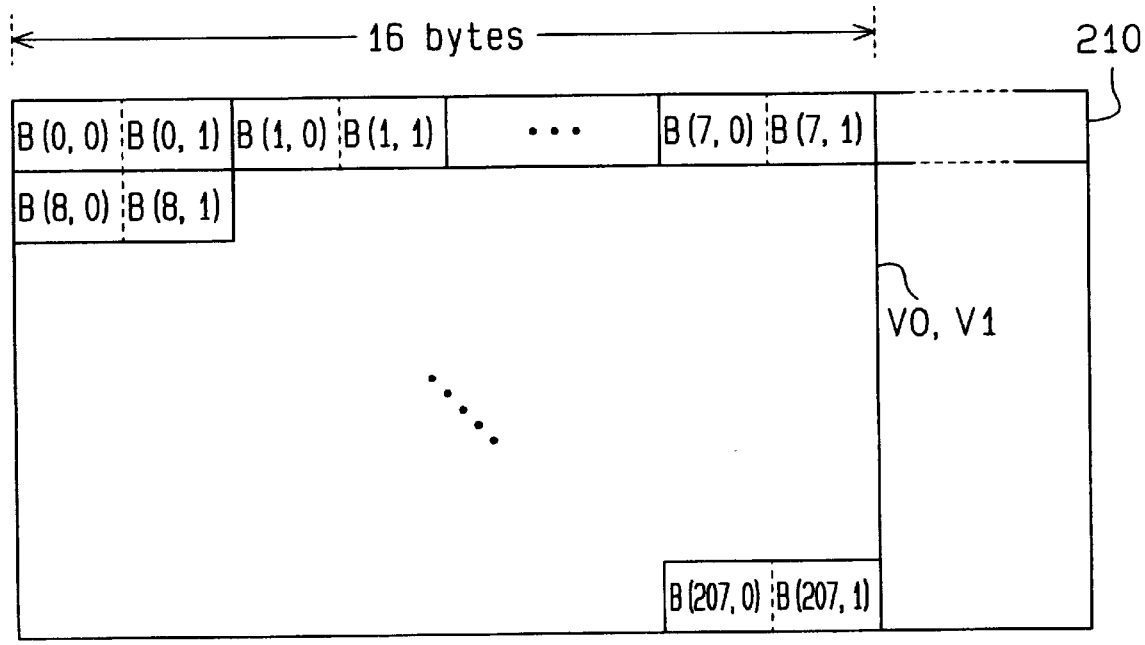
FIG. 18 shows the details of arrangement of data in FIG. 17.

According to the third embodiment, the format of data to be stored in the external buffer memory 27 may be changed as illustrated in FIGS. 17 and 18. FIG. 17 shows an example where two column interleaves are stored as a pair in the external buffer memory 27. In this case, byte data in each set of column interleaves whose quantity corresponds to the number of bytes to be accessed in a single access are stored in the same page area. For example, the data B(0, 0) and B(0, 1) to the data B(7, 0) and B(7, 1) in one set of column interleaves V0 and V1 are stored in the same page area 201 as shown in FIG. 18. The data in one set of column interleaves V0 and V1 are stored in the external buffer memory 27, starting from the same side in every unit of 16 bytes. This data format can allow writing of row interleaves and reading of column interleaves to be executed in the units of 16 bytes using the fast page mode. In other words, the access time can be shortened.

Although only several embodiments of the present invention have been described herein, it should be apparent to those skilled in the art that the present invention may be embodied in many other specific forms without departing from the spirit or scope of the invention. Particularly, it should be understood that the invention may be embodied in the following forms.

Figure 19:
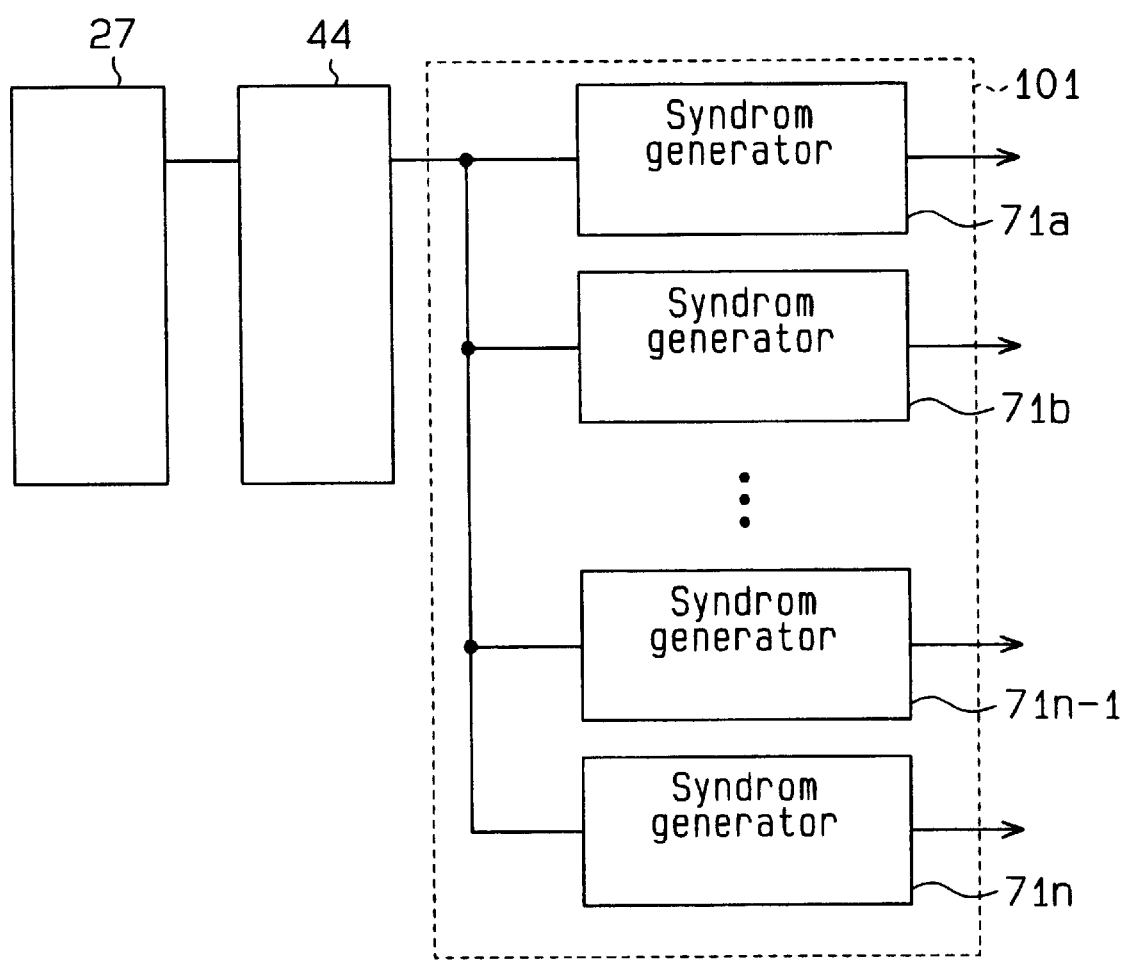
FIG. 19 is a block diagram showing another PO syndrome generating section which can be incorporated in any of the optical disk controllers of the first to third embodiments of the invention.

(1) The data bus width of the external buffer memory 27 may be changed to be equal to or greater than three bytes. In this case, as shown in FIG. 19, a POsyd section 101 includes n syndrome generators 71$a$ to 71$n$, the number "n"corresponding to the number of bytes. The individual syndrome generators 71$a$–71$n$ receive byte data in the associated row interleaves and generate their syndromes.

Figure 20:
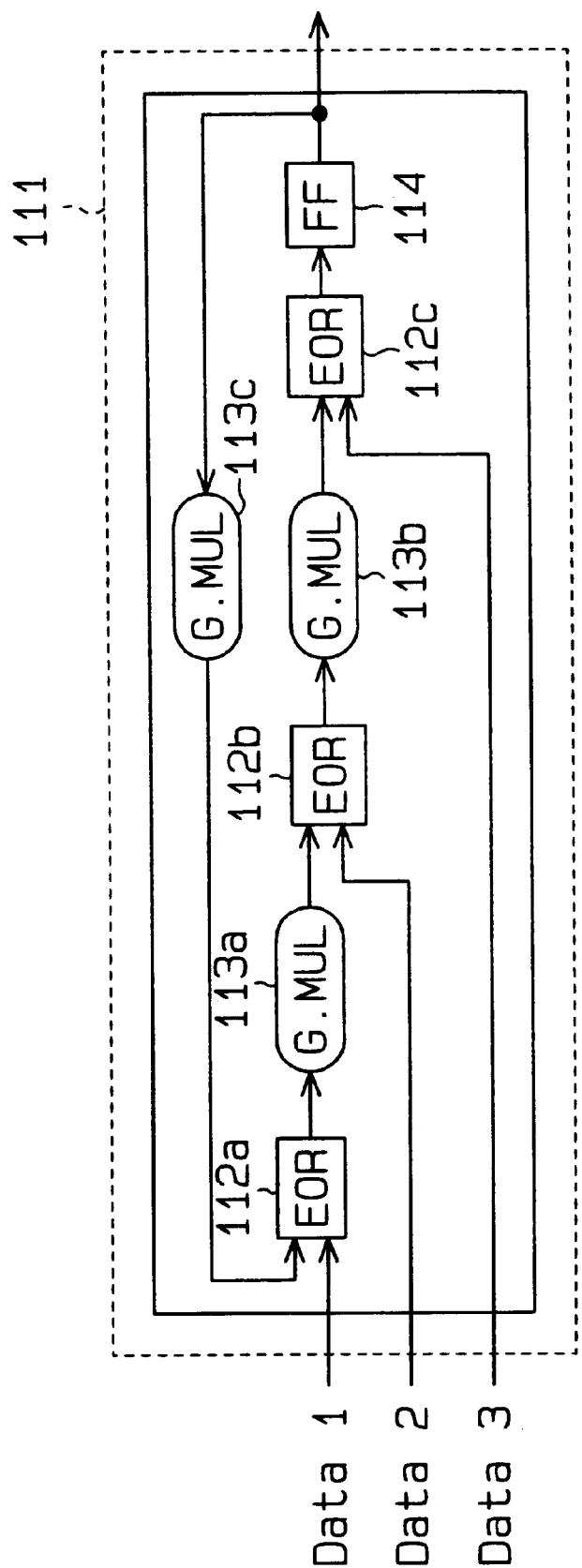
FIG. 20 is a block diagram illustrating a second PI syndrome generating section associated with the PO syndrome generating section in FIG. 19 according to the second embodiment of the invention.

According to the second embodiment, each syndrome generator 91 in the second PIsyd section 84 may be changed to a syndrome generator 111 designed for three bytes as shown in FIG. 20. Each syndrome generator 111 includes three EOR gates 112$a$ to 112$c$, three multipliers (G. MULS) 113$a$ to 113$c$ and an 8-bit flip-flop circuit (FF) 114. With respect to an n-byte data bus width, therefore, each syndrome generator includes n EOR gates 112$a$ to 112$n$, n multipliers (G. MULs) 113$a$ to 113$n$ and an FF 114.

(2) Instead of a DVD, an optical disk such as a laser disc (LD), compact disc (CD), CD-read only memory (CD-ROM), mini disc (MD), or DVD-read only memory (DVD-ROM) may be used as a recording medium as well.

(3) In place of Reed-Solomon codes, Bose-Chaudhuri-Hocquenghem (BCH) codes, hamming codes, cyclic codes or Golay codes may be used as error correcting codes as well.

Figure 21:
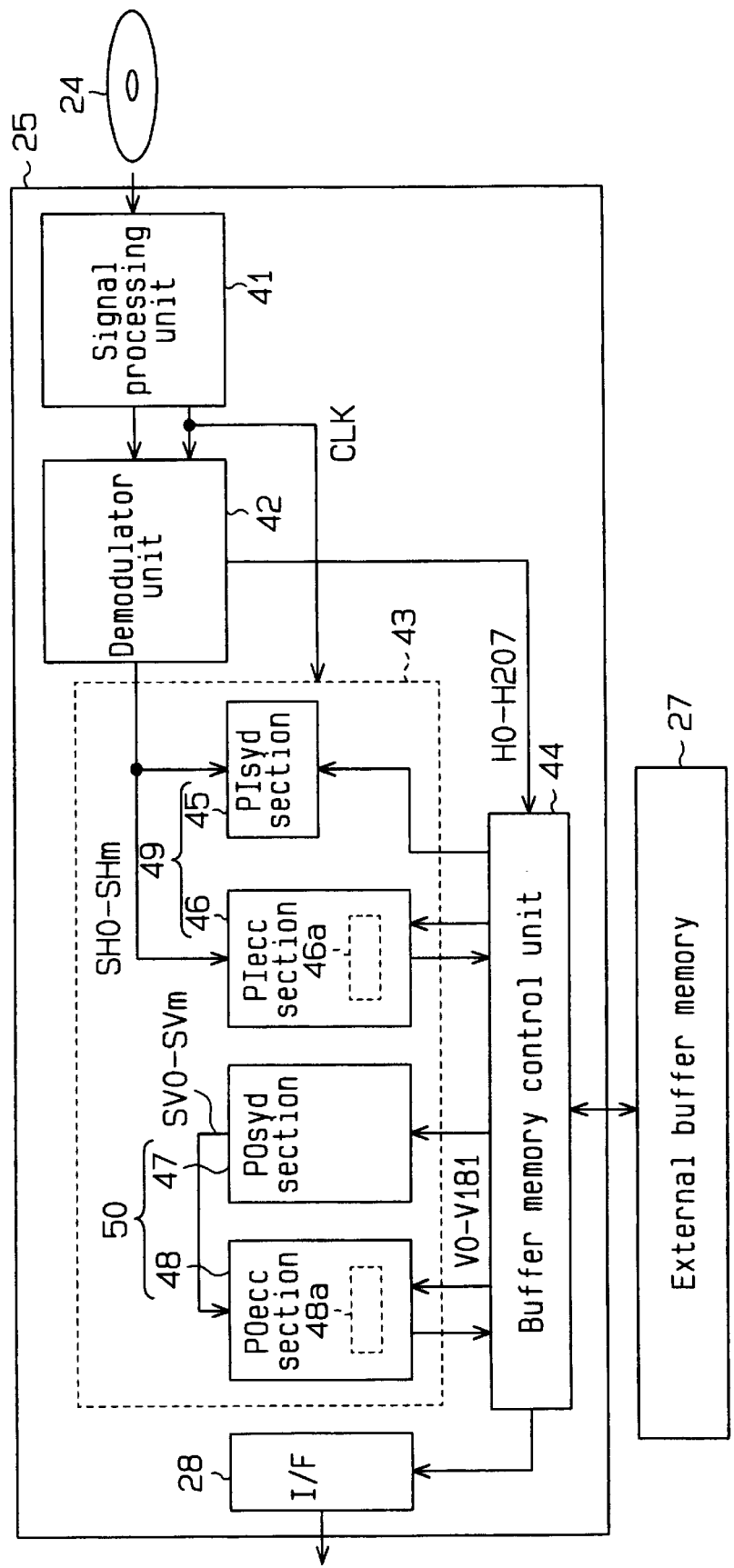
FIG. 21 is a block diagram illustrating an optical disk controller according to a modification of the first embodiment of the invention.

(4) As shown in FIG. 21, the buffer memory control unit 44 may receive data acquired from the DVD 24, and may sort the data in the order shown in FIG. 9 before storing it in the external buffer memory 27. The buffer memory control unit 44 sequentially receives the row interleaves H0–H207 from the external buffer memory 27 and supplies them to the row data error correcting circuit 49. Subsequently, the buffer memory control unit 44 receives the column interleaves V0–V181 from the external buffer memory 27 and supplies them to the column data error correcting circuit 50. In this modification, the PIsyd section 45 may receive the row interleaves H0–H207 as one set and may generate syndromes of two row interleaves in parallel.

(5) The following memories, which are designed in such a way that each memory has a plurality of limited memory areas and the access time for plural pieces of data stored in one memory area is shorter than the access time from one memory area to another, may be suitably used as the external buffer memory. Those memories include a DRAM having a fast page mode, a DRAM with an extended data out (EDO) mode and a synchronous DRAM (SDRAM).

Therefore, the present examples and embodiments are to be considered as illustrative and not restrictive and the invention is not to be limited to the details given herein, but may be modified within the scope and equivalence of the appended claims.

What is claimed is:

1. A method of correcting an error in block data having a matrix form including a plurality of rows of data and a plurality of columns of data, said method comprising:

performing row error correction including row error syndrome generation by using the plurality of rows of data to produce row-corrected block data; and performing column error correction including column error syndrome generation by using the plurality of columns of data to produce column-corrected block data;

wherein at least one of said performing row error correction and said performing column error correction includes simultaneously performing row or column error correction on a predetermined number of rows or columns of data, and wherein after performing one of said row error correction including the row error syndrome generation and said column error correction including the column error syndrome generation on the plurality of rows or columns of data, another one of said row error correction including the row error syndrome generation and said column error correction including the column error syndrome generation on the plurality of rows or columns of data is performed.

2. The method according to claim 1, further comprising:
using a memory including a data bus having a width large enough to permit passing of said plurality of rows of data in units of the predetermined number of rows;
writing said block data in said memory; and
reading said rows of data from said memory in units of said predetermined number of rows via said data bus, and
wherein said row error correction performing step includes:
generating data for row error correction in units of said predetermined number of rows in parallel by using said rows of data; and
simultaneously performing row error correcting processes on individual rows of data by using said data for row error correction.

3. The method according to claim 2, wherein said generating said data for row error correction in parallel includes generating error syndromes in units of said predetermined number of rows in parallel by using said rows of data as code words; and
said performing row error correcting processes simultaneously performs row error correcting processes on individual code words by using said error syndromes.

4. The method according to claim 1, further comprising:
using a memory including a data bus having a width large enough to permit passing of said plurality of columns of data in units of the predetermined number of columns;
writing said block data in said memory; and
reading said columns of data from said memory in units of said predetermined number of columns via said data bus, and
wherein said column error correction includes:
generating data for column error correction in units of said predetermined number of columns in parallel by using said columns of data; and
simultaneously performing column error correcting processes on individual columns of data by using said data for column error correction.

5. The method according to claim 4, wherein said generating said data for column error correction in parallel includes generating error syndromes in units of said predetermined number of columns in parallel by using said columns of data as code words; and
said simultaneously performing column error correcting processes simultaneously performs column error correcting processes on individual code words by using said error syndromes.

6. The method according to claim 1, further comprising:
using a memory including a data bus having a width large enough to permit passing of said rows and columns of data in units of a predetermined number of rows and a predetermined number of columns;
writing said row-error corrected block data in said memory in units of said predetermined number of rows via said data bus; and
reading said columns of data from said memory in units of said predetermined number of columns via said data bus, and
wherein said performing column error correction includes:
generating data for column error correction in units of said predetermined number of columns in parallel by using said columns of data; and
simultaneously performing column error correcting processes on individual columns of data by using said data for column error correction.

7. The method according to claim 6, wherein said generating said data for column error correction in parallel includes generating error syndromes in units of said predetermined number of columns in parallel by using said columns of data as code words; and
said simultaneously performing column error correcting processes simultaneously performs column error correcting processes on individual code words by using said error syndromes.

8. The method according to claim 1, further comprising:
using a memory including a data bus having a width large enough to permit passing of said rows and columns of data in units of a predetermined number of rows and a predetermined number of columns;
writing said column-error corrected block data in said memory in units of said predetermined number of columns via said data bus; and
reading said rows of data from said memory in units of said predetermined number of rows via said data bus, and wherein said performing row error correction includes:
generating data for row error correction in units of said predetermined number of rows in parallel by using said rows of data; and
simultaneously performing row error correcting processes on individual rows of data by using said data for row error correction.

9. The method according to claim 8, where in said generating said data for row error correction in parallel includes generating error syndromes in units of said predetermined number of rows in parallel by using said rows of data as code words; and
said simultaneously performing row error correcting processes simultaneously performs row error correcting processes on individual code words by using said error syndromes.

10. The method according to claim 1, wherein said plurality of rows of data and said plurality of columns of data each include a plurality of bytes,
wherein said method further comiprises:
using a memory including a data bus having a width large enough to permit passing of said rows and columns of data in units of a predetermined number of rows and a predetermined number of columns;
writing said row-error corrected block data in said memory in units of said predetermined number of rows via said data bus; and
reading said columns of data in units of said predetermined number of columns and in units of a predetermined number of bytes via said data bus, said predetermined number of bytes being set to an integer multiple of said width of said data bus, and
wherein said performing said column error correction includes:
generating data for column error correction in units of said predetermined number of columns and in units of said predetermined number of bytes in parallel by using said columns of data; and
simultaneously performing column error correcting processes on individual columns of data by using said data for column error correction.

11. The method according to claim 10, wherein generating said data for column error correction in parallel includes generating error syndromes in units of said predetermined number of columns and in units of said predetermined number of bytes in parallel by using said columns of data as code words; and said simultaneously performing column error correcting processes simultaneously performs column error correcting processes on individual code words by using said error syndromes.

12. The method according to claim 10, wherein said block data is recorded on a recording medium with said plurality of rows of data arranged in accordance with a first predetermined layout; and wherein said method further comprises:
reading said block data from said recording medium; and
sorting said plurality of rows of data in accordance with a second predetermined layout after execution of said row error correction; and
wherein said writing includes writing said row-error corrected and sorted block data in said memory in units of said predetermined number of rows via said data bus.

13. The method according to claim 1, wherein said plurality of rows of data and said plurality of columns of data each include a plurality of bytes;

wherein said method further comprises:
using a memory including a data bus having a width large enough to permit passing of said rows and columns of data in units of a predetermined number of rows and a predetermined number of columns;
writing said column-error corrected block data in said memory in units of said predetermined number of columns via said data bus; and
reading said rows of data in units of said predetermined number of rows and in units of a predetermined number of bytes via said data bus, said predetermined number of bytes being set to an integer multiple of said width of said data bus; and
wherein said performing row error correction includes:
generating data for row error correction in units of said predetermined number of rows and in units of said predetermined number of bytes in parallel by using said rows of data; and
simultaneously performing row error correcting processes on individual rows of data by using said data for row error correction.

14. The method according to claim 13, wherein said generating said data for row error correction in parallel includes generating error syndromes in units of said predetermined number of rows and in units of said predetermined number of bytes in parallel by using said rows of data as code words; and said simultaneously performing row error correcting processes simultaneously performs row error correcting processes on individual code words by using said error syndromes.

15. The method according to claim 13, wherein said block data is recorded on a recording medium with said plurality of rows of data arranged in accordance with a first predetermined layout;

wherein said method further comprises:
reading said block data from said recording medium; and
sorting said plurality of rows of data in accordance with a second predetermined layout after execution of said column error correction; and wherein said writing includes writing said column-error corrected and sorted block data in said memory in units of said predetermined number of rows via said data bus.

16. A method of mapping block data into a memory, said block data being in a matrix form and having a plurality of rows of data and a plurality of columns of data, said method comprising:

providing a memory having a data bus and a plurality of limited memory areas, said memory being designed so that when a part of block data is stored in one limited memory area, a speed of accessing said one limited memory area is faster than an access speed from one limited memory area to another limited memory area;

setting a width of said data bus of said memory wide enough to permit passing of a plurality of columns of data in units of a predetermined number of columns;

storing said block data in individual limited memory areas of said memory via said data bus, in units of a row, so that a part of a plurality of rows of data is stored in one limited memory area; and subsequently reading columns of data, associated with said part of said plurality of rows of data stored in said individual limited memory areas, from said memory via said data bus in units of said predetermined number of columns.

17. A method of correcting an error in block data in a matrix form having a plurality of rows of data and a plurality of columns of data, said method comprising:

providing a memory having a data bus and a plurality of limited memory areas, said memory being designed so that when a part of block data is stored in one limited memory area, a speed of accessing said one limited memory area is faster than an access speed from one limited memory area to another limited memory area;

setting a width of said data bus of said memory wide enough to permit passing of a plurality of columns of data in units of a predetermined number of columns;

performing row error correction in units of a row by using said rows of data to generate row-error corrected block data;

storing said block data in said memory via said data bus, in units of a row, so that a part of a plurality of rows of data is stored in one limited memory area;

reading columns of data, associated with said part of said plurality of rows of data stored in said limited memory areas, from said memory via said data bus in units of said predetermined number of columns; and simultaneously performing column error correcting processes on said predetermined number of columns by using said columns of data to generate column-error corrected block data.

18. A method of mapping block data into a memory, said block data being in a matrix form and having a plurality of rows of data and a plurality of columns of data, said method comprising:

providing a memory having a data bus and a plurality of limited memory areas, said memory being designed so that when a part of block data is stored in one limited memory area, a speed of accessing said one limited memory area is faster than an access speed from one limited memory area to another limited memory area;

setting a width of said data bus of said memory wide enough to permit passing of a plurality of rows of data in units of a predetermined number of rows;

storing said block data in individual limited memory areas of said memory via said data bus, in units of a column, so that a part of a plurality of columns of data is stored in one limited memory area; and subsequently reading rows of data, associated with said part of said plurality of columns of data stored in said individual limited memory areas, from said memory via said data bus in units of said predetermined number of rows.

19. A method of correcting an error in block data in a matrix form having a plurality of rows of data and a plurality of columns of data, said method comprising:

providing a memory having a data bus and a plurality of limited memory areas, said memory being designed so that when a part of block data is stored in one limited memory area, a speed of accessing said one limited memory area is faster than an access speed from one limited memory area to another limited memory area;

setting a width of said data bus of said memory wide enough to permit passing of a plurality of rows of data in units of a predetermined number of rows;

performing column error correction in units of a column by using said columns of data to generate column-error corrected block data;

storing said block data in said memory via said data bus, in units of a column, so that a part of a plurality of columns of data is stored in one limited memory area;

reading rows of data, associated with said part of said plurality of columns of data stored in said limited memory areas, from said memory via said data bus in units of said predetermined number of rows; and simultaneously performing row error correcting processes on said predetermined number of rows by using said rows of data to generate row-error corrected block data.

20. An apparatus for correcting an error in block data having a matrix form including a plurality of rows of data and a plurality of columns of data, said apparatus comprising:

a row error correction circuit for performing a row error correction including row error syndrome generation by using the plurality of rows of data to produce row-corrected block data; and a column error correction circuit for performing a column error correction including column error syndrome generation by using the plurality of columns of data to produce column-corrected block data;

wherein at least one of said row error correction circuit and said column error correction circuit simultaneously performs row or column correction on a predetermined number of rows or columns of data, and wherein after one of said row error correction circuit and said column error correction circuit performs row or column error correction including the row or column error syndrome generation on the plurality of rows or columns of data, another one of said row error correction circuit and said column error correction circuit performs row or column error correction including the row or column error syndrome generation on the plurality of rows or columns of data.

21. The apparatus according to claim 20, wherein said apparatus is coupled to an external memory through a data bus having a width large enough to permit passing of said rows of data in units of the predetermined number of rows;

wherein said apparatus further comprises a memory controller, coupled to said external memory, operating to write said block data in said memory and to read said rows of data from said memory in units of said predetermined number of rows via said data bus; and wherein said row error correction circuit generates data for row error correction in units of said predetermined number of rows in parallel by using said rows of data and simultaneously performs row error correcting processes on individual rows of data by using said data for row error correction.

22. The apparatus according to claim 21, wherein said row error correction circuit generates error syndromes in units of said predetermined number of rows in parallel by using said rows of data as code words and simultaneously performs row error correcting processes on individual code words by using said error syndromes.

23. The apparatus according to claim 20, wherein said apparatus is coupled to an external memory through a data bus having a width large enough to permit passing of said plurality of columns of data in units of the predetermined number of columns;

wherein said apparatus further comprises a memory controller, coupled to said external memory, operating to write said block data in said memory and read said columns of data from said memory in units of said predetermined number of columns via said data bus; and wherein said column error correction circuit generates data for column error correction in units of said predetermined number of columns in parallel by using said columns of data and simultaneously performs column error correcting processes on individual columns of data by using said data for column error correction.

24. The apparatus according to claim 23, wherein said column error correction circuit generates error syndromes in units of said predetermined number of columns in parallel by using said columns of data as code words and simultaneously performs column error correcting processes on individual code words by using said error syndromes.

25. The apparatus according to claim 20, wherein said apparatus is coupled to an external memory through a data bus having a width large enough to permit passing of said rows and columns of data in units of a predetermined number of rows and a predetermined number of columns;

wherein said apparatus further comprises a memory controller operating to write said row-error corrected block data in said memory in units of said predetermined number of rows via said data bus and to read said columns of data from said memory in units of said predetermined number of columns via said data bus; and wherein said column error correction circuit generates data for column error correction in units of said predetermined number of columns in parallel by using said columns of data and simultaneously performs column error correcting processes on individual columns of data by using said data for column error correction.

26. The apparatus according to claim 25, wherein said column error correction circuit generates error syndromes in units of said predetermined number of columns in parallel by using said columns of data as code words and simultaneously performs column error correcting processes on individual code words by using said error syndromes.

27. The apparatus according to claim 20, wherein said apparatus is coupled to an external memory through a data bus having a width large enough to permit passing of said rows and columns of data in units of a predetermined number of rows and a predetermined number of columns;

wherein said apparatus further comprises a memory controller operating to write said column-error corrected block data in said memory in units of said predetermined number of columns via said data bus and to read said rows of data from said memory in units of said predetermined number of rows via said data bus; and wherein said row error correction circuit generates data for row error correction in units of said predetermined number of rows in parallel by using said rows of data and simultaneously performs row error correcting processes on individual rows of data by using said data for row error correction.

28. The apparatus according to claim 27, wherein said row error correction circuit generates error syndromes in units of said predetermined number of rows in parallel by using said rows of data as code words and simultaneously performs row error correcting processes on individual code words by using said error syndromes.

29. The apparatus according to claim 20, wherein said plurality of rows of data and said plurality of columns of data each include a plurality of bytes;

wherein said apparatus is coupled to an external memory through a data bus having a width large enough to permit passing of said rows and columns of data in units of a predetermined number of rows and a predetermined number of columns;

wherein said apparatus further comprises a memory controller operating to write said row-error corrected block data in said memory in units of said predetermined number of rows via said data bus and to read said columns of data in units of said predetermined number of columns and in units of a predetermined number of bytes via said data bus, said predetermined number of bytes being set to an integer multiple of said width of said data bus; and wherein said column error correction circuit generates data for column error correction in units of said predetermined number of columns and in units of said predetermined number of bytes in parallel by using said columns of data and simultaneously performs column error correcting processes on individual columns of data by using said data for column error correction.

30. The apparatus according to claim 29, wherein said column error correction circuit generates error syndromes in units of said predetermined number of columns and in units of said predetermined number of bytes in parallel by using said columns of data as code-words and simultaneously performs column error correcting processes on individual code words by using said error syndromes.

31. The apparatus according to claim 29, wherein said block data is recorded on a recording medium with said plurality of rows of data arranged in accordance with a first predetermined layout;

wherein said row error correction circuit reads said block data from said recording medium and performs row error correcting processes; and wherein said memory controller sorts said plurality of rows of data in accordance with a second predetermined layout after execution of said row error correction and writes said row-error corrected and sorted block data in said memory in units of said predetermined number of rows via said data bus.

32. The apparatus according to claim 20, wherein said plurality of rows of data and said plurality of columns of data each include a plurality of bytes;

wherein said apparatus is coupled to an external memory through a data bus having a width large enough to permit passing of said rows and columns of data in units of a predetermined number of rows and a predetermined number of columns;

wherein said apparatus further comprises a memory controller operating to write said column-error corrected block data in said memory in units of said predetermined number of columns via said data bus and to read said rows of data in units of said predetermined number of rows and in units of a predetermined number of bytes via said data bus, said predetermined number of bytes being set to an integer multiple of said width of said data bus; and wherein said row error correction circuit generates data for row error correction in units of said predetermined number of rows and in units of said predetermined number of bytes in parallel by using said rows of data and simultaneously performs row error correcting processes on individual rows of data by using said data for row error correction.

33. The apparatus according to claim 32, wherein said row error correction circuit generates error syndromes in units of said predetermined number of rows and in units of said predetermined number of bytes in parallel by using said rows of data as code words and simultaneously performs row error correcting processes on individual code words by using said error syndromes.

34. The apparatus according to claim 32, wherein said block data is recorded on a recording medium with said plurality of rows of data arranged in accordance with a first predetermined layout;

wherein said column error correction circuit reads said block data from said recording medium and performs column error correcting processes; and wherein said memory controller sorts said plurality of rows of data in accordance with a second predetermined layout after execution of said column error correction and writes said column-error corrected and sorted block data in said memory in units of said predetermined number of rows via said data bus.

35. An apparatus for correcting an error in block data having a matrix form including a plurality of rows of data and a plurality of columns of data, said apparatus being coupled to an external memory through a data bus and having a plurality of limited memory areas, said external memory being designed so that when a part of said block data is stored in one of said limited memory areas, a speed of accessing said one of said limited memory areas is faster than an access speed from one limited memory area to another limited memory area, said data bus having a width large enough to permit passing of a plurality of columns of data in units of a predetermined number of columns, said apparatus comprising:

a row error correction circuit performing row error correction in units of a row by using said rows of data to generate row-error corrected block data;

a memory controller, coupled to said external memory and said row error correction circuit, storing said block data in said memory via said data bus, in units of a row, so that a part of a plurality of rows of data is stored in one of said limited memory areas, and reading columns of data, associated with said part of said plurality of rows of data stored in said one of said limited memory areas, from said memory via said data bus in units of said predetermined number of columns; and a column error correction circuit simultaneously performing column error correcting processes on said predetermined number of columns by using said columns of data to generate column-error corrected block data.

36. An apparatus for correcting an error in block data having a matrix form including a plurality of rows of data and a plurality of columns of data, said apparatus being coupled to an external memory through a data bus and having a plurality of limited memory areas, said external memory being designed so that when a part of said block data is stored in one of said limited memory areas, a speed of accessing said one of said limited memory areas is faster than an access speed from one limited memory area to another limited memory area, said data bus having a width large enough to permit passing of a plurality of rows of data in units of a predetermined number of rows, said apparatus comprising:

a column error correction circuit performing column error correction in units of a column by using said columns of data to generate column-error corrected block data;

a memory controller, coupled to said external memory and said column error correction circuit, storing said block data in said memory via said data bus, in units of a column, so that a part of a plurality of columns of data is stored in one of said limited memory areas and for reading rows of data, associated with said part of said plurality of columns of data stored in said one of said limited memory areas, from said memory via said data bus in units of said predetermined number of rows; and a row error correction circuit simultaneously performing row error correcting processes on said predetermined number of rows by using said rows of data to generate row error corrected block data.

37. A method for correcting an error in block data having a matrix form including a plurality of rows and columns of data, comprising:

performing row and then column error correction, including row and column error syndrome generation, using the plurality of rows and columns of data to produce row-corrected and column-corrected block data; and performing another one of row or column error correction, including row or column error syndrome generation, on the plurality of rows or columns of data;

wherein said performing row error correction or said performing column error correction or both use a predetermined number of rows or columns of data respectively to perform simultaneous row or column error correction.

* * * * *

UNITED STATES PATENT AND TRADEMARK OFFICE
CERTIFICATE OF CORRECTION

PATENT NO.: 6,158,038
DATED : December 5, 2000
INVENTOR(S): Yamawaki et al.

It is certified that errors appears in the above-identified patent and that said Letters Patent is hereby corrected as shown below:

TITLE PAGE,
    FOREIGN PATENT DOCUMENTS:
    change "061208430 B1" to --06120843--.

Column 18,
    line 46, change "comiprises" to --comprises--.

Signed and Sealed this

First Day of May, 2001

NICHOLAS P. GODICI

*Attest:*

*Attesting Officer*     Acting Director of the United States Patent and Trademark Office